United States Patent
Fermann et al.

(10) Patent No.: US 11,881,681 B2
(45) Date of Patent: Jan. 23, 2024

(54) PRECISION LIGHT SOURCE

(71) Applicant: IMRA America, Inc., Ann Arbor, MI (US)

(72) Inventors: Martin E. Fermann, Dexter, MI (US); Kevin F. Lee, Ann Arbor, MI (US)

(73) Assignee: IMRA America, Inc., Ann Arbor, MI (US)

(*) Notice: Subject to any disclaimer, the term of this patent is extended or adjusted under 35 U.S.C. 154(b) by 380 days.

(21) Appl. No.: 17/113,409

(22) Filed: Dec. 7, 2020

(65) Prior Publication Data
US 2021/0194210 A1    Jun. 24, 2021

Related U.S. Application Data

(60) Provisional application No. 63/022,100, filed on May 8, 2020, provisional application No. 62/952,030, filed on Dec. 20, 2019.

(51) Int. Cl.
*H01S 3/00* (2006.01)
*H01S 5/0625* (2006.01)
(Continued)

(52) U.S. Cl.
CPC ........ *H01S 5/06253* (2013.01); *H01S 3/0057* (2013.01); *H01S 3/0092* (2013.01);
(Continued)

(58) Field of Classification Search
CPC .. H01S 3/0057; H01S 3/0092; H01S 3/06754; H01S 3/06758; H01S 3/2316
See application file for complete search history.

(56) References Cited

U.S. PATENT DOCUMENTS 5,689,519 A   11/1997  Fermann et al.
6,885,683 B1   4/2005  Fermann et al.
(Continued)

FOREIGN PATENT DOCUMENTS

WO   WO 2004/109869   12/2004

OTHER PUBLICATIONS

Nisoli, "Ultra-broadband continuum generation by hollow-fiber cascading," Nov. 2002, 75, pp. 601-604. (Year: 2002).*
(Continued)

*Primary Examiner* — Michael Carter
(74) *Attorney, Agent, or Firm* — Knobbe, Martens, Olson & Bear, LLP

(57) ABSTRACT

A pulse transformer for modifying the amplitude and phase of short optical pulses includes a pulse source and an adaptively controlled stretcher or compressor including at least one fiber Bragg grating (FBG) configured to receive pulses from the pulse source and having a first second-order dispersion parameter ($D_{21}$). The pulse transformer further includes at least one optical amplifier configured to receive pulses from the FBG and a compressor configured to receive pulses from the at least one optical amplifier. The compressor has a second second-order dispersion parameter ($-D_{22}$), an absolute value of the first second-order dispersion parameter ($|D_{21}|$) and an absolute value of the second second-order dispersion parameter ($|-D_{22}|$) that are substantially equal to one another to within 10%.

10 Claims, 18 Drawing Sheets

(51) Int. Cl.
　　　H01S 5/02251　　(2021.01)
　　　H01S 5/065　　　(2006.01)
　　　H01S 3/23　　　 (2006.01)
(52) U.S. Cl.
　　　CPC ........ *H01S 5/02251* (2021.01); *H01S 5/0657* (2013.01); *H01S 3/2316* (2013.01)

(56) References Cited

U.S. PATENT DOCUMENTS

| | | | |
|---|---|---|---|
| 7,414,780 | B2 | 8/2008 | Fermann et al. |
| 7,688,499 | B2 | 3/2010 | Fermann et al. |
| 8,031,396 | B2 | 10/2011 | Fermann et al. |
| 8,830,567 | B2 * | 9/2014 | Lin ................. H01S 3/0057 359/341.1 |
| 8,861,555 | B2 | 10/2014 | Fermann et al. |
| 9,036,971 | B2 | 5/2015 | Hartl et al. |
| 9,553,421 | B2 | 1/2017 | Fermann |
| 10,096,962 | B2 | 10/2018 | Fermann |
| 2004/0263950 | A1 * | 12/2004 | Fermann ............ H01S 3/06754 359/333 |
| 2013/0293941 | A1 | 11/2013 | Harter et al. |
| 2019/0190224 | A1 | 1/2019 | Lee et al. |
| 2022/0149579 | A1 * | 5/2022 | Yusim .................. H01S 3/0057 |

OTHER PUBLICATIONS

Peck, "Dispersion of Argon," Journal of the optical society of America, 1964, vol. 54, No. 11 pp. 1362-1364. (Year: 1964).*

Shestaev, "High-power ytterbium-doped fiber laser delivering few-cycle, carrier-envelope phase-stable 100 µJ pulses at 100 KHz," Jan. 1, 2020 (posted Nov. 14, 2019; published Dec. 18, 2019, vol. 45, No. 1, pp. 97-100. (Year: 1999).*

T. Fordell et al., "High-speed carrier-envelope phase drift detection of amplified laser pulses," Op. Express, vol. 19, No. 24, p. 23652-23657 (2011).

A.F.J. Runge et al., "The pure-quartic soliton laser," Nature Photonics, vol. 14, pp. 492-497, arXiv: 1910.10314 (2019).

A. Rolland et al., "Ultra-broadband dual-branch optical frequency comb with $10^{-18}$ instability," Optica, vol. 5, 1070 (2018).

E. Shestaev et al., "High-power ytterbium-doped fiber laser delivering few-cycle, carrier-envelope phase-stable 100 µJ pulses at 100 kHz," Op. Lett. Vol. 45, No. 1, pp. 97-100 (2020).

J. S. Travers et al., "High-energy pulse self-compression and ultraviolet generation through soliton dynamics in hollow capillary fibres," Nature Photonics, vol. 13, 547 (2019).

F. Verluise et al., "Amplitude and phase control of ultrashort pulses by use of an acousto-optic programmable dispersive filter: pulse compression and shaping," Opt. Lett., 25, 575 (2000).

K. Wang et al., "Comb offset frequency measurement using two-photon—three-photon quantum interference control," CLEO 2017, Paper JTh2A.68 (2017).

J. Weitenberg et al., "Multi-pass-cell-based nonlinear pulse compression to 115 fs at 7.5 µJ pulse energy and 300 W average power," Opt. Lett., 25, 20502 (2017).

International Search Report and Written Opinion dated Mar. 18, 2021 for Int'l Appl. No. PCT/US2020/063575.

* cited by examiner

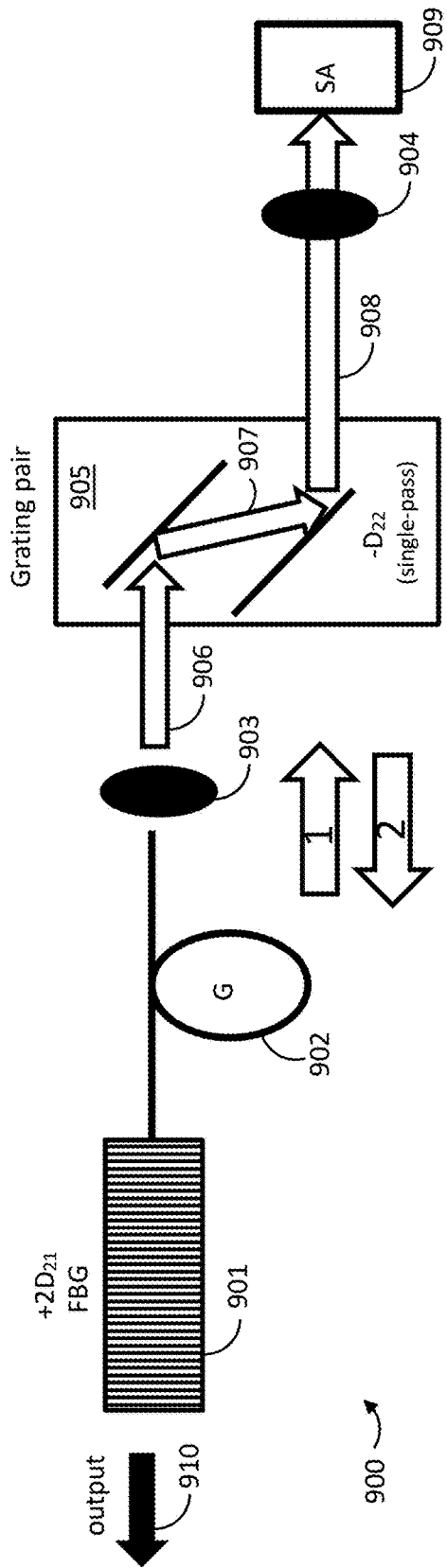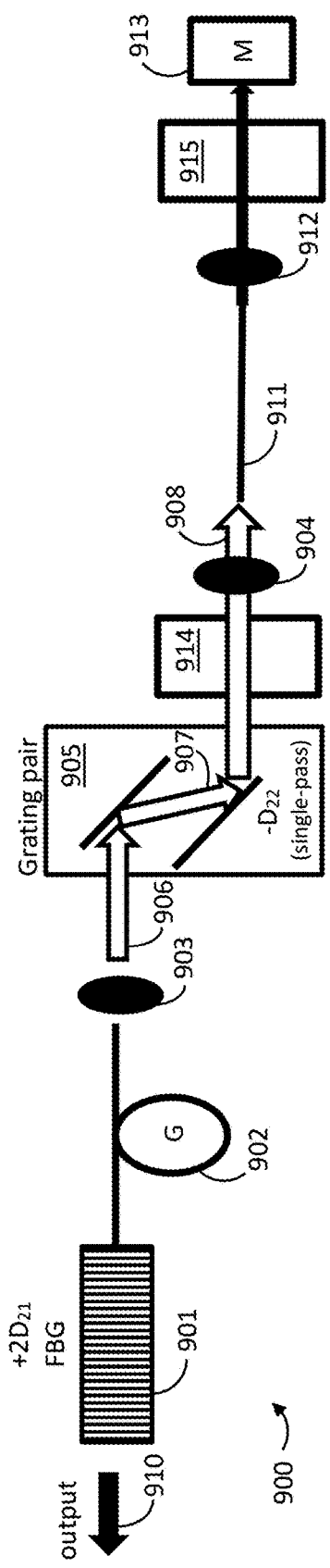
FIG. 17A:
FIG. 17B:

PRECISION LIGHT SOURCE

CLAIM OF PRIORITY

This application claims the benefit of priority to U.S. Provisional Appl. Nos. 62/952,030 filed on Dec. 20, 2019 and 63/022,100 filed on May 8, 2020, each of which is incorporated in its entirety by reference herein.

BACKGROUND

Field

The present application relates generally to the generation and control of few cycle light pulses.

Description of the Related Art

Ultra-short pulse lasers (e.g., lasers generating pulses with pulse widths in a range of 100 femtoseconds (fs) to 1 picosecond (ps)) have become firmly established in technology during the last two decades and have found applications in many different areas, ranging from laser machining to precision metrology. Though the forefront of laser technology has moved to sub-100 fs laser pulses and even attosecond laser pulses, any such laser systems have barely been used in the commercial realm because of the complexity and limited robustness of such systems.

SUMMARY

In certain implementations, a nonlinear fiber laser based chirped pulse amplification system is configured to generate output pulses in the femtosecond pulse width range. The system comprises a seed pulse source configured to produce short optical pulses. The system further comprises a fiber Bragg grating (FBG) pulse stretcher system configured to stretch said pulses, at least one amplifier, at least one FBG compressor configured to compress said pulses, and a bulk dispersive element for further compressing the pulses emerging from the FBG compressor. The FBG stretcher dispersion is configured to optimize the pulse quality of said output pulses at a designated elevated power level, said optimization in pulse quality producing a functional dependence of pulse quality on average pulse power or pulse energy in at least three stages: at low powers, the output pulses have a longer temporal width compared to said designated power level, at medium powers, the output pulses exhibit several side pulses with an intensity higher than any side pulses produced at said designated power level, and at said designated power level, the pulse quality is optimized, as characterized by side pulses with an intensity smaller than observed at medium power levels.

In certain implementations, a nonlinear fiber laser based chirped pulse amplification system is configured to generate output pulses in the sub-30 femtosecond pulse width range. The system comprises a seed pulse source configured to produce short optical pulses. The system further comprises a fiber Bragg grating (FBG) pulse stretcher system configured to stretch said pulses, at least one amplifier, at least one FBG compressor configured to compress said pulses, a bulk dispersive element configured to further compress the pulses emerging from the FBG compressor, and at least one optical fiber for further pulse compression of the pulses emerging from the FBG compressor.

In certain implementations, an optical source comprises a seed source configured to produce short optical pulses, one or more actuators configured to control the carrier envelope offset frequency of the output of said seed source, and a splitter configured to split the output of said seed source into an amplifier branch and an f-2f branch. The optical source further comprises a frequency shifter in said f-2f branch, an f-2f interferometer in said f-2f branch, and a photodetector configured to detect the f-2f signal from said f-2f interferometer. The optical source further comprising a combiner configured to interfere a portion of light from said f-2f branch with a portion of light from said amplifier branch, a photodetector configured to detect light from said combiner, electronics configured to convert the signals from both said photodetectors into a signal representing the carrier envelope offset frequency at the output of said amplifier branch, and a feedback circuit configured to control the carrier envelope offset frequency at the output of said amplifier branch.

In certain implementations, a nonlinear fiber laser based chirped pulse amplification system is configured to generate output pulses in the femtosecond pulse width range. The system comprises a seed pulse source configured to produce short optical pulses, at least one fiber Bragg grating (FBG) pulse stretcher or compressor configured to stretch or compress pulses anywhere within said nonlinear fiber based chirped pulse amplification system, adaptive dispersion control of said at least one FBG, and a gas filled hollow fiber compressor for further compression of said output pulses.

In certain implementations, a method produces femtosecond pulses with a nonlinear chirped pulse amplification system seeded with an oscillator. The method comprises temporally stretching said pulses with a FBG, amplifying said pulses, and compressing said pulses to produce compressed output pulses. The FBG is configured to optimize the pulse quality of said output pulses at a designated elevated power level, said optimization in pulse quality producing a functional dependence of pulse quality on average pulse power or pulse energy in at least three stages: at low powers, the output pulses have a longer temporal width compared to said designated power level, at medium powers, the output pulses exhibit several side pulses with an intensity higher than any side pulses produced at said designated power level, and at said designated power level the pulse quality is optimized, as characterized by side pulses with an intensity smaller than observed at medium power levels. In certain such implementations, a peak intensity of the pulses is at a maximum at the designated power level.

In certain implementations, a pulse source comprises an oscillator configured to generate laser pulses and at least one fiber Bragg grating (FBG) pulse stretcher configured to receive the laser pulses from the oscillator and to temporally stretch the laser pulses, the at least one FBG pulse stretcher configured to be adaptively controlled to provide adjustable dispersion. The pulse source further comprises at least one amplifier configured to receive the temporally stretched laser pulses, at least one FBG pulse compressor configured to receive the laser pulses from the at least one amplifier and to temporally compress the laser pulses, and one or more optical compressor components configured to receive and further compress the compressed laser pulses from the at least one FBG pulse compressor.

In certain implementations, a pulse transformer for modifying the amplitude and phase of short optical pulses is provided. The pulse transformer comprises a pulse source and a stretcher comprising at least one fiber Bragg grating (FBG) configured to receive pulses from the pulse source. The stretcher has a first second-order dispersion parameter ($D_{21}$). The pulse transformer further comprises at least one optical amplifier configured to receive pulses from the at least one FBG. The pulse transformer further comprises a compressor configured to receive pulses from the at least one optical amplifier. The compressor has a second second-order dispersion parameter ($-D_{22}$), an absolute value of the first second-order dispersion parameter ($|D_{21}|$) and an absolute value of the second second-order dispersion parameter ($|-D_{22}|$) that are substantially equal to one another to within 10%. At least one of the stretcher and the compressor is configured to be adaptively controlled. For example, the compressor can comprise an FBG and one or both of the FBG of the stretcher and the FBG of the compressor can be adaptively controlled.

In certain implementations, a pulse transformer for generating short optical pulses with reduced pulse curvature is provided. The pulse transformer comprises a pulse source and a positive dispersion pulse stretcher comprising at least one positive dispersion element. The pulse stretcher has a second-order dispersion parameter ($D_{21}$). The pulse transformer further comprises a first nonlinear element configured to receive stretched pulses from the positive dispersion pulse stretcher and to subject the stretched pulses to self-phase modulation. The pulse transformer further comprises a negative dispersion pulse compressor comprising at least one negative dispersion element. The pulse compressor has a second-order dispersion parameter ($-D_{22}$) having an absolute value ($|-D_{22}|$) that is substantially equal to an absolute value ($|D_{21}|$) of the second-order dispersion parameter of the pulse stretcher to within 10%. The pulse transformer further comprises a second nonlinear element configured to receive pulses from the pulse compressor and to subject the received pulses to bandwidth broadening. The pulse transformer further comprises a dispersive element configured to compress pulses received from the second nonlinear element.

In certain implementations, a high energy passively mode-locked fiber oscillator is provided. The oscillator comprises a pump source and a cavity comprising a fiber Bragg grating at a first end of the cavity. The fiber Bragg grating has a second-order dispersion component ($D_{21}$). The oscillator further comprises a plurality of cavity elements within the cavity. The plurality of cavity elements comprises at least one optical fiber comprising at least one gain fiber. The at least one optical fiber has a summed second-order dispersion component ($D_{22}$), where an absolute value of $D_{21}$ ($|D_{21}|$) is greater than 20 times than an absolute value of $D_{22}$ ($|D_{22}|$), ($|D_{21}|>20*|D_{22}|$). The plurality of cavity elements further comprises a generalized fast saturable absorber. A pulse width of pulses propagating within the oscillator fluctuates by more than a factor of 10 along the cavity.

In certain implementations, a high energy passively mode-locked fiber oscillator is provided. The oscillator comprises a pump source and a cavity comprising a fiber Bragg grating at one end of the cavity. The fiber Bragg grating has a second-order dispersion component ($D_{21}$). The oscillator further comprises a plurality of cavity elements within the cavity. The plurality of cavity elements comprises at least one optical fiber comprising at least one gain fiber. The at least one optical fiber has a summed second-order dispersion component ($D_{22}$), where an absolute value of $D_{21}$ ($|D_{21}|$) is greater than 20 times than an absolute value of $D_{22}$ ($|D_{22}|$), ($|D_{21}|>20*|D_{22}|$). The plurality of cavity elements further comprises a generalized fast saturable absorber configured to generate optical pulses with an intra-cavity pulse width less than or equal to 1 ps at a position within the cavity.

In certain implementations, a nonlinear fiber laser based chirped pulse amplification system is provided. The system comprises a seed pulse source configured to produce optical pulses having pulse widths less than 10 picoseconds. The system further comprises at least one fiber Bragg grating (FBG) pulse stretcher or compressor configured to stretch or compress the optical pulses. The at least one FBG has adaptive dispersion control. The system further comprises a gas filled hollow fiber compressor configured to further compress the optical pulses that are stretched or compressed by the at least one FBG pulse stretcher or compressor. For example, optical pulses outputted from the gas filled hollow fiber compressor can have pulse widths less than or equal to 30 femtoseconds

BRIEF DESCRIPTION OF THE DRAWINGS

FIG. 17A schematically illustrates an example near dispersion compensated high energy mode-locked oscillator incorporating a highly dispersive fiber Bragg grating in accordance with certain implementations described herein.

FIG. 17B schematically illustrates another example near dispersion compensated high energy mode-locked oscillator incorporating a highly dispersive fiber Bragg grating in accordance with certain implementations described herein.

The figures depict various implementations of the present disclosure for purposes of illustration and are not intended to be limiting. Wherever practicable, similar or like reference numbers or reference labels may be used in the figures and may indicate similar or like functionality.

DETAILED DESCRIPTION

Certain implementations described herein advantageously provide compact and highly robust laser systems than can further technological developments with pulse sources generating pulses with pulse widths that are a few tens of femtoseconds, or pulse widths that are less than or equal to 10 fs.

Certain implementations described herein advantageously provide compact few cycle fiber laser sources employing several pulse compression stages. In certain implementations, the effects of gain narrowing in fiber amplifiers are counteracted by implementing nonlinear amplification schemes (e.g., nonlinear chirped pulse amplification; similariton amplification). In certain implementations, particularly high pulse energies are reached by combining such fiber laser sources with pulse compression in gas-filled hollow fibers.

Certain implementations described herein advantageously enable high precision carrier phase control via coherence transfer between two amplifiers seeded with a single oscillator. In certain such implementations, single-pass common mode wide-band frequency combs can be constructed that allow for efficient coherence transfer from the infrared (IR) radiation to visible light. Moreover, in certain implementations, pump pulses generated with Yb, Er, Tm, or Ho fiber lasers allow for efficient near single cycle mid-IR pulse generation with an output spanning over more than one octave.

Overview

Adaptive control of the output of pulsed fiber systems has been known for some time (see, e.g., U.S. Pat. Nos. 7,414,780 and 10,096,962). Such systems are generally designed to compensate the dispersion mismatch in chirped pulse amplification systems, incorporating a dispersive pulse stretcher and a dispersive pulse compressor. The pulse stretcher can, for example, be a fiber grating pulse stretcher and the compressor can be a bulk grating compressor or a volume Bragg grating compressor. Moreover, an adaptive pulse stretcher can be implemented for the compensation of self-phase modulation in such systems.

Previous efforts have addressed control of the carrier phase of short pulse fiber lasers without addressing any means for tunable carrier phase generation or applications in precision coherence transfer from the IR to the visible (see, e.g., U.S. Pat. No. 9,036,971). scheme for precision coherence transfer from the IR to the visible was discussed in A. Rolland et al., "Ultra-broadband dual-branch optical frequency comb with $10^{-18}$ instability," Optica, Vol. 5, 1070 (2018), in which both visible and IR supercontinuum (SC) sources, centered respectively at 780 nm and 1560 nm, were used. However, such systems are difficult to assemble, since they utilize two supercontinua of the sources that are overlapped in time with high precision, and with coherence control.

Short Pulse Generation

Figure 1:
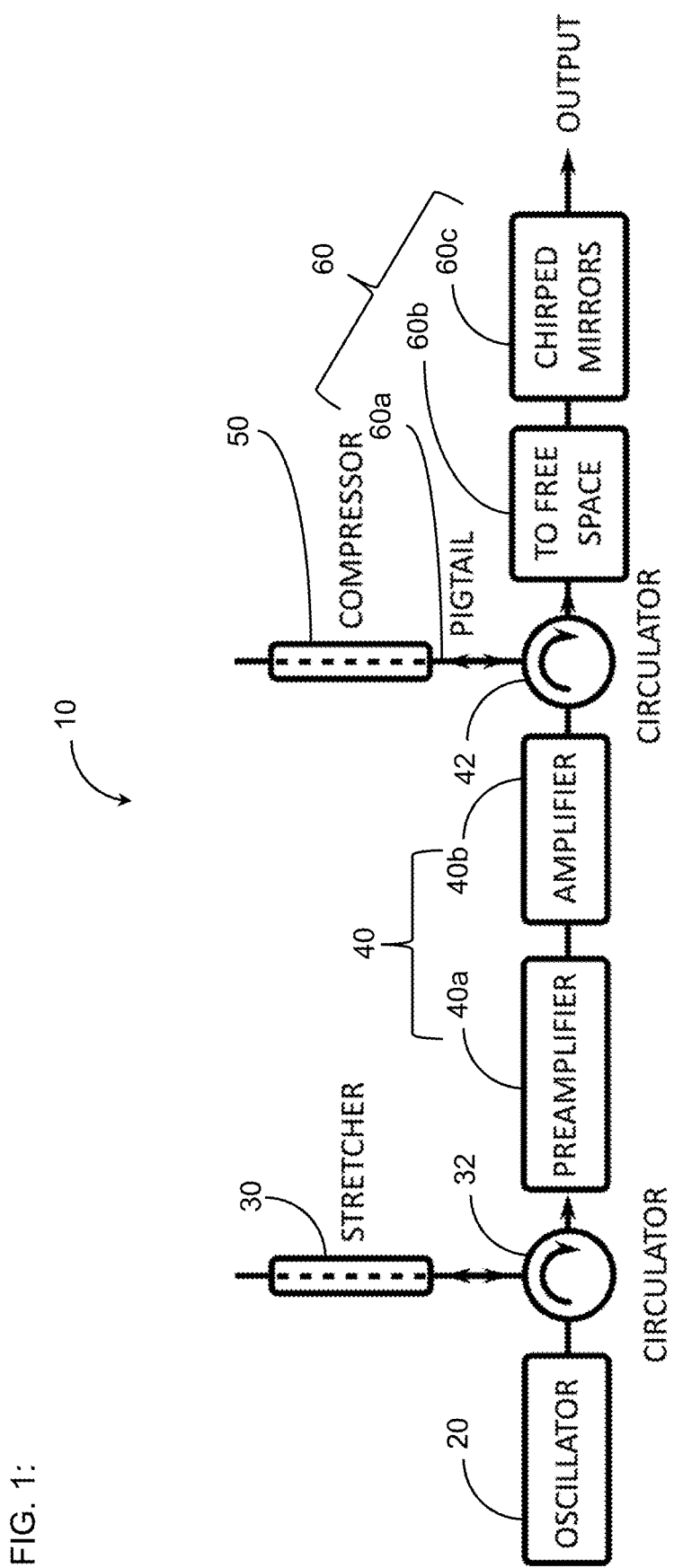
FIG. 1 schematically illustrates an example high power femtosecond pulse source in accordance with certain implementations described herein.

Certain implementations disclosed herein provide a simplified scheme for broadband SC generation based on a high power, femtosecond pulse source. FIG. 1 schematically illustrates an example high power femtosecond pulse source 10 in accordance with certain implementations described herein. The pulse source 10 can be used as the front end to near single cycle pulse sources, as further described herein (see, e.g., FIG. 5). As described herein, the pulse source 10 of certain implementations disclosed herein comprises a fiber grating pulse compressor that advantageously facilitates a compact design of the pulse source architecture. The pulse source 10 of certain such implementations can further comprise a fiber grating pulse stretcher to advantageously facilitate further compactness.

In certain implementations, the pulse source 10 comprises an oscillator 20 configured to generate short laser pulses (e.g., pulses having pulse widths in a range of 30 to 600 femtoseconds). For example, the oscillator 20 can comprise a mode-locked Er fiber laser configured to generate laser pulses with a wavelength at or near 1.55 microns. Other example oscillators 20 compatible with certain implementations described herein include but are not limited to fiber lasers comprising one or more of the following materials: Nd, Yb, Tm, Ho, and Er/Yb; solid-state laser oscillators; semiconductor laser oscillators. In certain implementations, the oscillator 20 comprises at least one pre-amplifier (not shown) configured to amplify the laser pulses after being emitted from the oscillator 20.

In certain implementations, the pulse source 10 further comprises at least one pulse stretcher 30 configured to receive the laser pulses from the oscillator 20 and to temporally stretch the laser pulses (e.g., to increase the pulse widths of the laser pulses to be in a range of 100 fs to 1000 ps). For example, the at least one pulse stretcher 30 can comprise at least one fiber grating pulse stretcher 30 (e.g., at least one fiber Bragg grating (FBG) pulse stretcher) and configured to receive the laser pulses from the oscillator 20 (e.g., via a circulator 32) and to reflect and transmit temporally stretched laser pulses. In certain implementations, the circulator 32 comprises bulk optical components with free-space propagation between the optical components (e.g., to reduce or minimize nonlinear pulse distortions. While the at least one fiber grating pulse stretcher 30 of certain implementations provides a predetermined (e.g., desired) dispersion to generate short output pulses, in certain other implementations, the at least one fiber grating pulse stretcher 30 is configured to be adaptively controlled to provide adjustable dispersion, as described more fully herein, to enable further improvement of pulse quality, either because the correct dispersion profile is not known at design time, or laser conditions such as output power are variable.

In certain implementations, the pulse source 10 further comprises at least one amplifier 40 configured to receive the temporally stretched laser pulses (e.g., via the circulator 32). For example, as schematically illustrated by FIG. 1, the at least one amplifier 40 comprises a preamplifier 40a and an amplifier 40b.

In certain implementations, the pulse source 10 further comprises at least one pulse compressor 50 configured to receive the laser pulses from the at least one amplifier 40 and to temporally compress the laser pulses (e.g., to decrease the pulse widths of the laser pulses to be in a range of 50 to 1000 femtoseconds. For example, the at least one pulse compressor 50 can comprise at least one fiber grating pulse compressor 50 (e.g., at least one FBG pulse compressor) configured to receive the laser pulses from the at least one amplifier 40 (e.g., via a circulator 42) and to temporally compress the laser pulses. In certain implementations, the circulator 42 comprises bulk optical components with free-space propagation between the optical components (e.g., to reduce or minimize nonlinear pulse distortions.

In certain implementations, the pulse source 10 further comprises one or more optical compressor components 60 configured to receive and further compress the compressed laser pulses from the at least one pulse compressor 50 (e.g., prior to the laser pulses being emitted by the pulse source 10). For example, as schematically illustrated by FIG. 1, the one or more optical compressor components 60 can comprise a length of optical fiber pigtail 60a after the fiber grating pulse compressor 50 (e.g., between the fiber grating pulse compressor 50 and the circulator 42), the optical fiber pigtail 60a comprising a nonlinear optical fiber configured to further temporally compress the laser pulses. In certain implementations, the one or more optical compressor components 60 further comprises an essentially dispersion-free free-space propagation section 60b configured to receive the temporally compressed laser pulses from the optical fiber pigtail 60a (e.g., via the circulator 42).

In certain implementations, the one or more optical compressor components 60 further comprises one or more other optical compressor components 60c, examples of which include but are not limited to, one or more optical fibers, chirped mirrors, or other optical materials configure to provide a predetermined dispersion resulting in a predetermined (e.g., desired) pulse quality, pulse width, and/or pulse peak power for the laser pulses emitted by the pulse source 10.

In certain implementations, the fiber grating pulse stretcher 30 is configured to be adaptively controlled (e.g., to maximize the pulse quality of the laser pulses emerging from the pulse source 10). In certain such implementations, the adaptive control of the fiber grating pulse stretcher 30 induces second-, third-, or higher-order dispersion in the fiber grating pulse compressor 50. Such adaptively induced second-, third-, or higher-order dispersion can compensate for nonlinear self-phase modulation (SPM) induced pulse distortions in the fiber grating pulse compressor 50 and the subsequent fiber pigtail 60a, which (e.g., for SPM values greater than 1 or higher) could otherwise severely limit the pulse quality at the output of the free-space propagation section 60b and/or the one or more other optical compressor components 60c. In certain implementations, the adaptive control can essentially induce higher-order dispersion of any order that pre-compensates for complex SPM induced pulse distortions. Induced adaptive dispersion changes can affect the propagation through the whole system, so in certain implementations, the control parameters in the fiber grating pulse stretcher 30 can be modified by monitoring the pulse quality (e.g., at the output of the one or more optical components 60). In certain implementations, an iterative optimization procedure can be implemented to optimize the adaptive FBG control with regard to the optimized compressed pulse quality. Certain implementations described herein are configured to pre-compensate for the nonlinear dispersion terms in the fiber grating pulse compressor 50 and the fiber pigtail 60a (e.g., to reduce or minimize the adaptive changes in the dispersion terms of the fiber grating pulse stretcher 30 to improve or optimize pulse quality). Certain such implementations can completely obviate the need for adaptive control for less involved assembly (e.g., without spatially selective thermal control of the fiber grating stretcher 30). In certain implementations, adaptive dispersion control can also be implemented directly in the fiber grating pulse compressor 50 which can be advantageous (e.g., for reducing or minimizing cross coupling between nonlinear pulse propagation in the system and the adaptive control).

Figure 2:
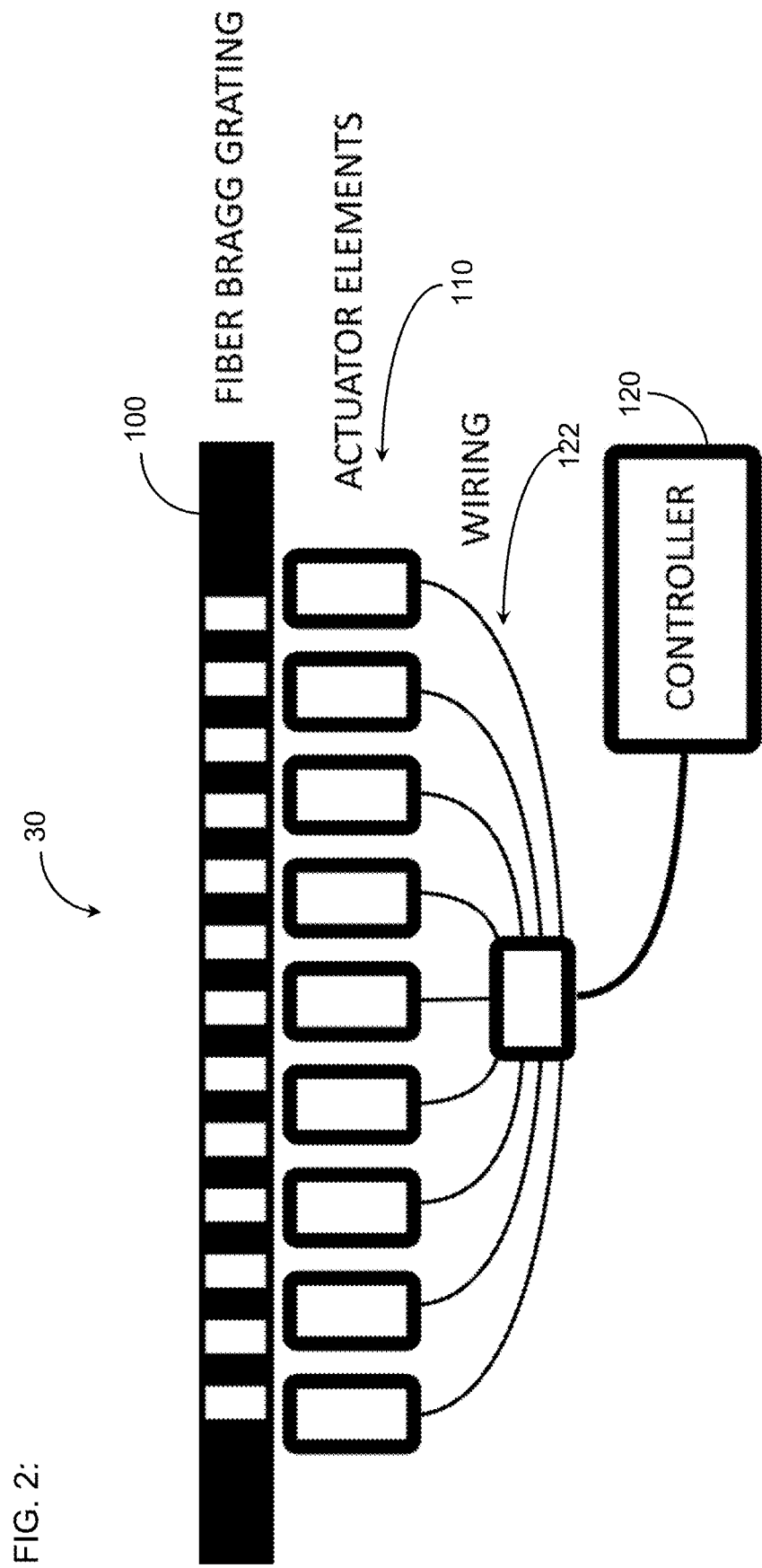
FIG. 2 schematically illustrates an example adaptive fiber grating pulse stretcher compatible for use in the example pulse source of FIG. 1 in accordance with certain implementations described herein.

FIG. 2 schematically illustrates an example adaptive fiber grating pulse stretcher 30 compatible for use in the example pulse source 10 of FIG. 1 in accordance with certain implementations described herein. The adaptive fiber grating pulse stretcher 30 comprises a FBG 100, a plurality of actuator elements 110 configured to apply perturbations to corresponding portions of the FBG 100, and a controller 120 in electrical communication with the plurality of actuator elements 110 (e.g., via a plurality of wires 122 in electrical communication with the controller 120 and the actuator elements 110). For example, the FBG 100 can have a length of 5 cm and the plurality of actuator elements 110 can comprise 10 or more individually addressable elements. Example actuator elements include, but are not limited to: temperature actuators (e.g., electrical resistive heaters; thermoelectric devices) configured to apply temperature perturbations (e.g., on the order of 10 degrees Celsius or more), bending actuators (e.g., separate arms mechanically fixed to portions of the FBG 100 and configured to be moved relative to one another), and pressure actuators (e.g., piezoelectric transducers) configured to apply pressure perturbations. Example configurations of the example adaptive fiber grating pulse stretcher of FIG. 2 are disclosed in U.S. Pat. Nos. 7,414,780 and 10,096,962, each of which is incorporated in its entirety by reference herein.

In certain implementations, the controller 120 comprises manual controls (e.g., potentiometers for controlling voltages) and/or computerized controls (e.g., integrated circuit; microcontroller) for convenience and automated functions. For example, computerized controls can be used for compensating for system changes over time, for adjusting to requested changes such as output power, or for purposely adjusting the pulse shape or chirp for specific applications. The appropriate setting of the controller 120 can be determined while monitoring a measurement of the laser (e.g., an autocorrelation signal; the output power after frequency doubling) or can be determined once and then recalled for specific situations. In certain implementations, the controller 120 is configured to apply an algorithm (e.g., either manually or automatically) to determine the appropriate settings. For example, the algorithm can comprise repeatedly maximizing the pulse second harmonic autocorrelation peak value for each actuator element 110, which can be sufficient to achieve good results. More sophisticated algorithms, such as downhill simplex methods or stochastic parallel gradient descent (SPGD) algorithms, can be used for faster convergence. In more complicated implementations, such as generating specific pulse shapes, more flexible algorithms, such as simulated annealing or genetic algorithms, can improve performance.

Figure 3:
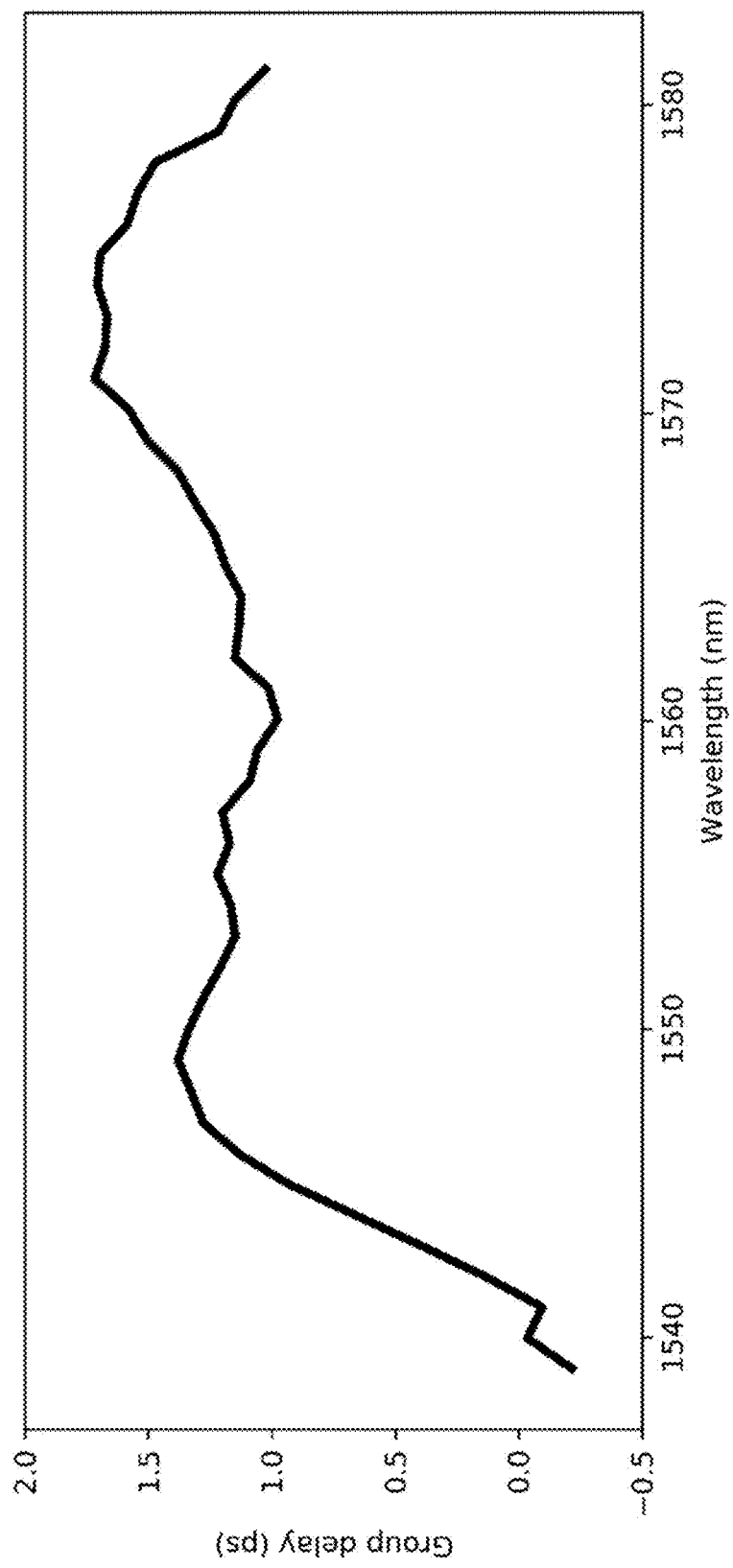
FIG. 3 shows a measured dispersion profile induced for optimum pulse quality at the output of the example pulse source of FIG. 1.
Figure 4:
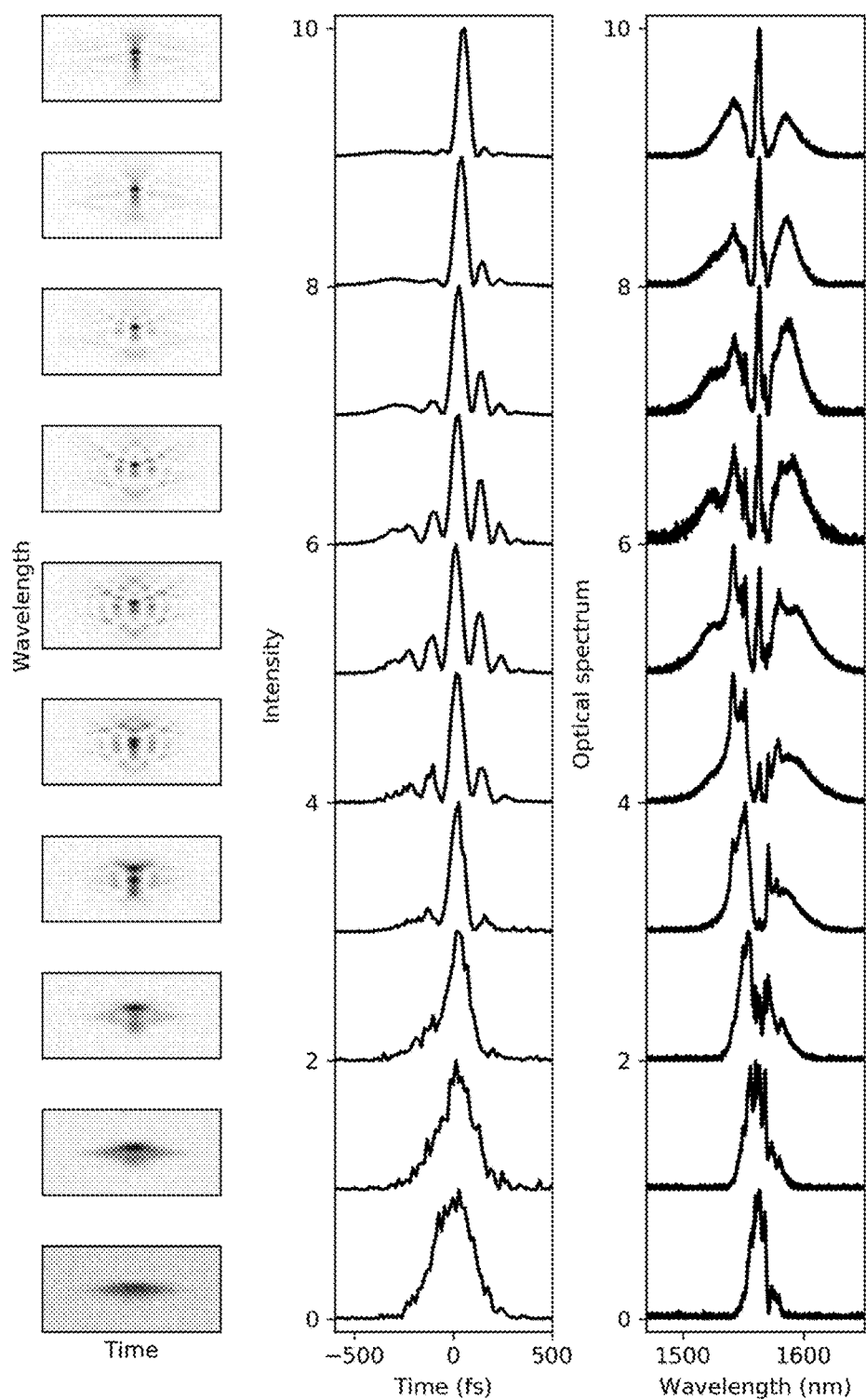
FIG. 4 shows measurements of the pulse quality as a function of average output power obtained at the output of the example pulse source of FIG. 1.

FIG. 3 shows a measured dispersion profile induced for optimum pulse quality at the output of the example pulse source 10 of FIG. 1. In FIG. 3, the measured dispersion profile of the FBG of the adaptive fiber grating pulse stretcher 30 generates 50 nJ pulses with a pulse width of around 60 fs, with a pulse repetition rate of 100 MHz and an obtained average power of 5.0 W. Once an optimized dispersion profile in the adaptive fiber grating pulse stretcher 30 is set, a distinct evolution of the pulse quality with an increase in pulse energy (or average power) can be observed. FIG. 4 shows measurements of the pulse quality as a function of average output power obtained at the output of the example pulse source 10 of FIG. 1. The obtained pulse quality is shown in FIG. 4 as the average power is increased from 0.5 W at the bottom of FIG. 4 to 5.0 W at the top of FIG. 4, with about 0.5 W per step. Temporal and spectral intensities are normalized and vertically shifted for ease of viewing. The left-hand side of FIG. 4 shows a frequency resolved optical gating (FROG) traces of the output pulses, and the middle of FIG. 4 shows the temporal profile of the output pulses, and the right-hand side of FIG. 4 shows the spectral measurements. The increase in average power can, for example, be obtained via an increase in pump power delivered to the at least one amplifier 40 (e.g., the final power amplifier 40b) in the pulse source 10.

In certain implementations, as shown in FIG. 4, the pulse quality goes through at least three distinct regimes: at low pump power (e.g., less than 1.5 W), the pulse source 10 is substantially linear and provides relatively long pulses without pulse structure. At higher power levels (e.g., in the range of 1.5 W to 3.5 W), the pulse quality deteriorates markedly and is worst at the upper portion of the range (e.g., power levels between 2.5 W and 3.5 W) where the interplay of dispersion from the fiber grating pulse stretcher 30 and SPM in the fiber grating pulse compressor 50 and the fiber pigtail 60a generates several side-peaks to the main pulse. For power levels greater than 3.5 W, the pulse quality improves and reaches a maximum (e.g., for an average power of 5.0 W), manifested in a minimization of any side peaks.

Figure 5:
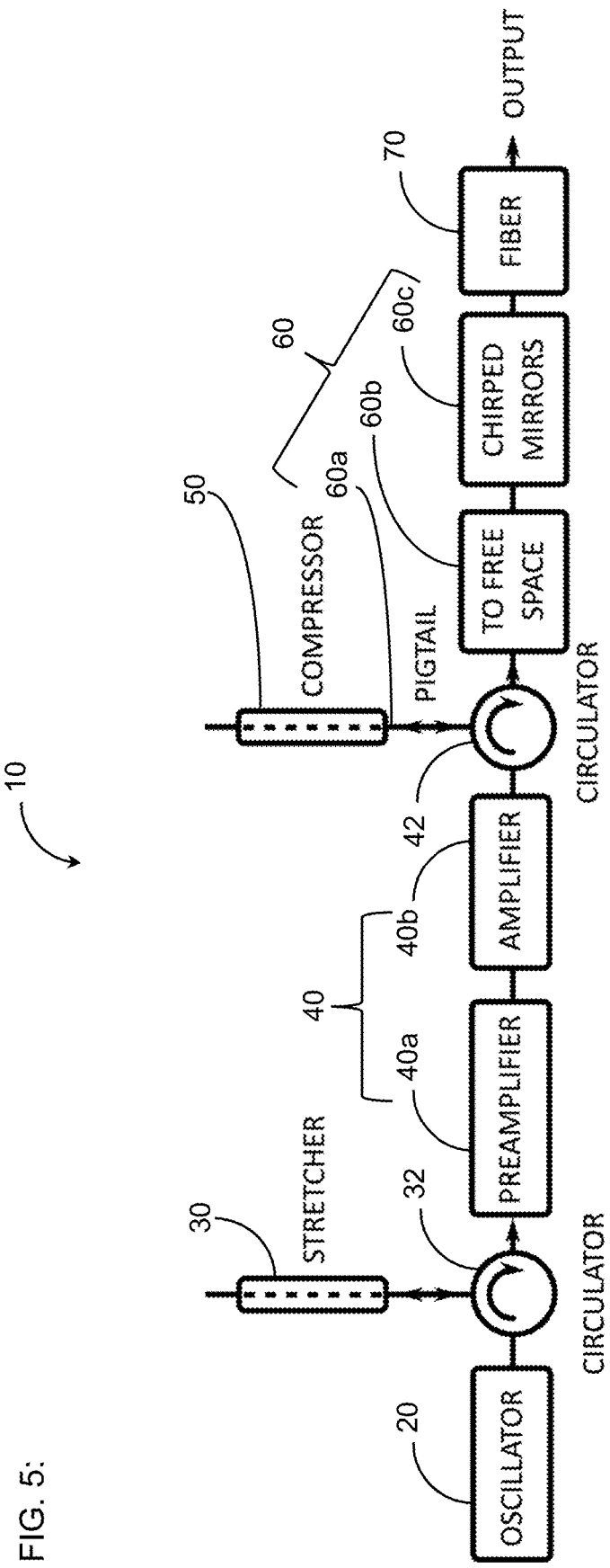
FIG. 5 schematically illustrates an example system comprising the example pulse source of FIG. 1 with an added fiber pulse compressor in accordance with certain implementations described herein.

In certain implementations, as schematically illustrated by FIG. 5, high quality, high energy output pulses generated by the example pulse source 10 of FIG. 1 can be compressed to single cycle pulse widths or near single cycle pulse width by injecting the pulses into a fiber pulse compressor 70 (e.g., a short length of optical fiber). The fiber length of the fiber pulse compressor 70 can range from a few millimeters to a few centimeters. Because of the relatively high pulse energy, the fiber pulse compressor 70 of certain implementations utilizes relatively large core fibers (e.g., with mode-diameters greater than 5 microns; greater than 10 microns; greater than 15 µm). The mode diameters can be larger than those typically used for supercontinuum generation from short pulse fiber lasers, and hence supercontinuum spectra with significantly higher spectral density, compared to standard fiber technology, can be obtained.

Figure 6:
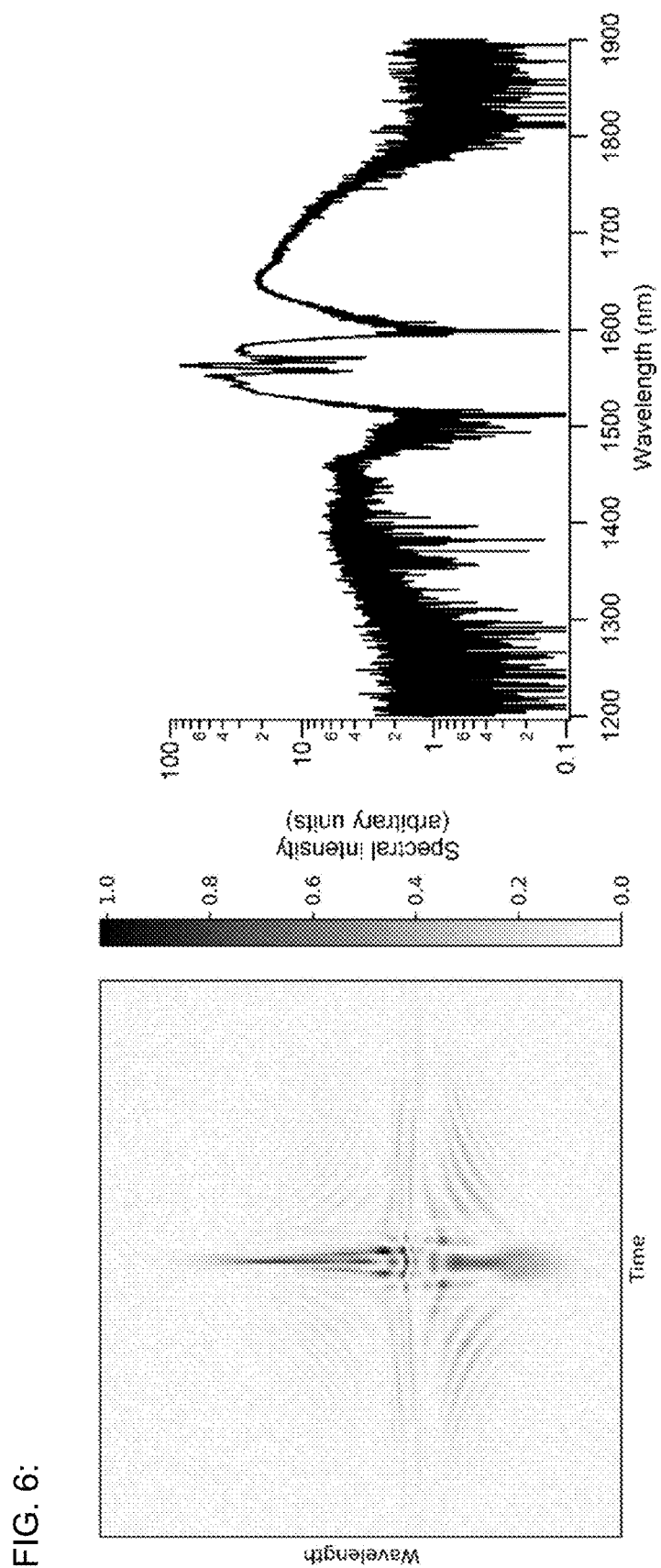
FIG. 6 illustrates a FROG trace and the spectrum of a near single cycle pulse generated at the output of the example system of FIG. 5.

FIG. 6 illustrates a FROG trace and a spectrum of a near single cycle pulse having a pulse width of 17 fs and a pulse energy of 31 nJ generated at the output of the example single cycle pulse source 10 of FIG. 5. The spectrum can extend from 1200 nm to 1800 nm and can reach an octave or more when implementing slightly longer fiber lengths in the example single cycle pulse source 10 of FIG. 5. For near single cycle pulse generation, the fiber pulse compressor 70 of certain implementations comprises a combination of two sections of compressor fiber (e.g., which can be spliced together): a first fiber section having near zero dispersion near the center wavelength of the injection pulse (e.g., a dispersion value $D_{zero}$, where $|D|<7.5$ ps$^2$/km) and a second fiber section having negative dispersion (e.g., a dispersion value $D_{neg}<-15$ ps$^2$/km). In certain implementations, the fiber pulse compressor 70 comprises three or more sections of fiber (e.g., which can all be spliced together) comprising a first fiber section configured to generate only limited spectral broadening, a second fiber section configured to compress the pulses to close to the bandwidth limit while generating large spectral broadening, and a third fiber section configured to generate further spectral broadening.

As shown in FIG. 6, the short pulses generated by certain implementations described herein exhibit two distinct relatively smooth distal spectral regions, which are arranged around a central spectral region. In certain implementations, these two spectral regions can be mixed in a nonlinear crystal to generate mid-IR radiation via difference frequency mixing (see, e.g., U.S. Pat. No. 8,861,555). The central spectral region can also be involved in the nonlinear mixing process, which can also be referred to as intra-pulse difference frequency generation or optical rectification.

Figure 7:
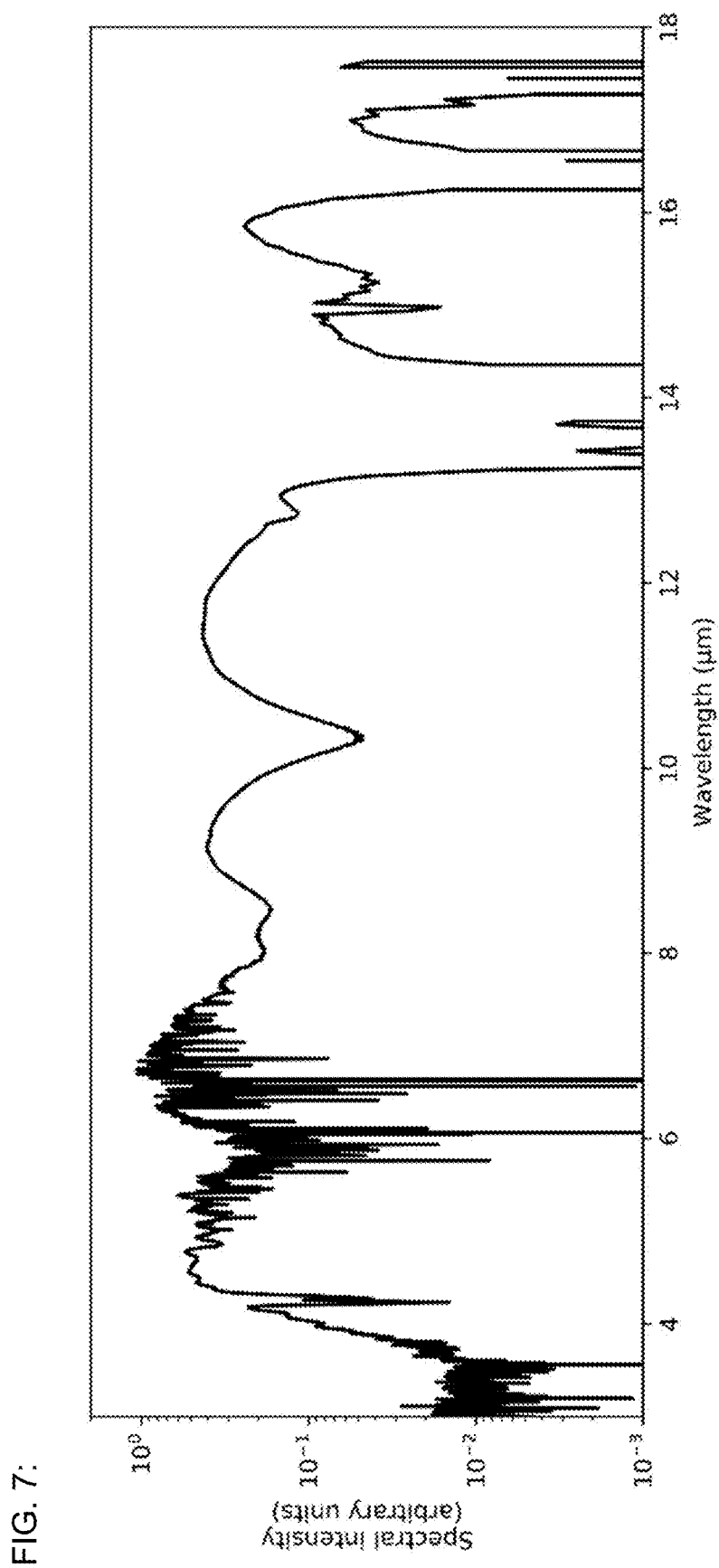
FIG. 7 shows a mid-IR spectrum obtained by focusing the output of the example system of FIG. 5 into a nonlinear crystal in accordance with certain implementations described herein.

FIG. 7 shows a mid-IR spectrum obtained by focusing the output of the example near single cycle pulse source 10 of FIG. 5 into a nonlinear crystal in accordance with certain implementations described herein. The mid-IR spectrum of FIG. 7 was generated using a nonlinear crystal based on an optically patterned GaP (OPGaP) and extends from 3.7 microns to 17 microns. In certain other implementations, broader spectral coverage can be obtained by using longer compressor fibers for the fiber pulse compressor 70 than those used in generating the mid-IR spectrum of FIG. 7. In certain implementations, the output power in the broad mid-IR spectrum can be greater than 500 µW, greater than 1 mW, or greater than 10 mW. By implementing phase matching, certain implementations described herein can further enhance the spectral density in a predetermined spectral region and can obtain further power increases. The high spectral density achievable with few cycle pulse sources in accordance with certain implementations described herein further allows applications in nonlinear microscopy, such as two photon microscopy and coherent anti-Stokes Raman (CARS) microscopy. For some application, further frequency doubling or frequency tripling of the output spectra can be implemented.

Measurement and Stabilization of Carrier Envelope Offset Frequency

In certain implementations, the pulse source 10 can be configured with precise control of one of the carrier envelope offset frequency $f_{ceo}$ and the repetition rate, or both for adaptation to frequency comb applications (e.g., frequency transfer, mid-IR generation, control of few-cycle phenomena). In certain frequency comb implementations, the $f_{ceo}$ of the laser output is measured by an f-2f interferometer in a separate branch which is configured to have the same $f_{ceo}$ as the main laser branch going to the application. This type of arrangement can be insufficient for precision applications, particularly with strongly amplified lasers and long amplifier lengths, as typical for fiber laser systems.

In certain implementations, the pulse source 10 is configured to measure and stabilize the $f_{ceo}$ of the beam that is going to the application. For example, $f_{ceo}$ can be stabilized to a continuous range of values from $f_{ceo}=0$ to the MHz range, making the pulse source 10 universally useable for essentially any comb application. By using a single arm DFG system (see, e.g., U.S. Pat. No. 8,861,555 which is incorporated in its entirety by reference herein), certain implementations described herein can automatically obtain $f_{ceo}=0$ at the DFG output of the high power branch.

In certain implementations, $f_{ceo}$ of the beam sent to the application is stabilized by optically comparing a fraction of the application beam to a beam from a separately configured f-2f interferometer branch (e.g., arm). Using additional electronic mixing, certain implementations can generate a radio frequency (RF) signal that is appropriate for stabilizing the $f_{ceo}$ of the application beam.

Figure 8:
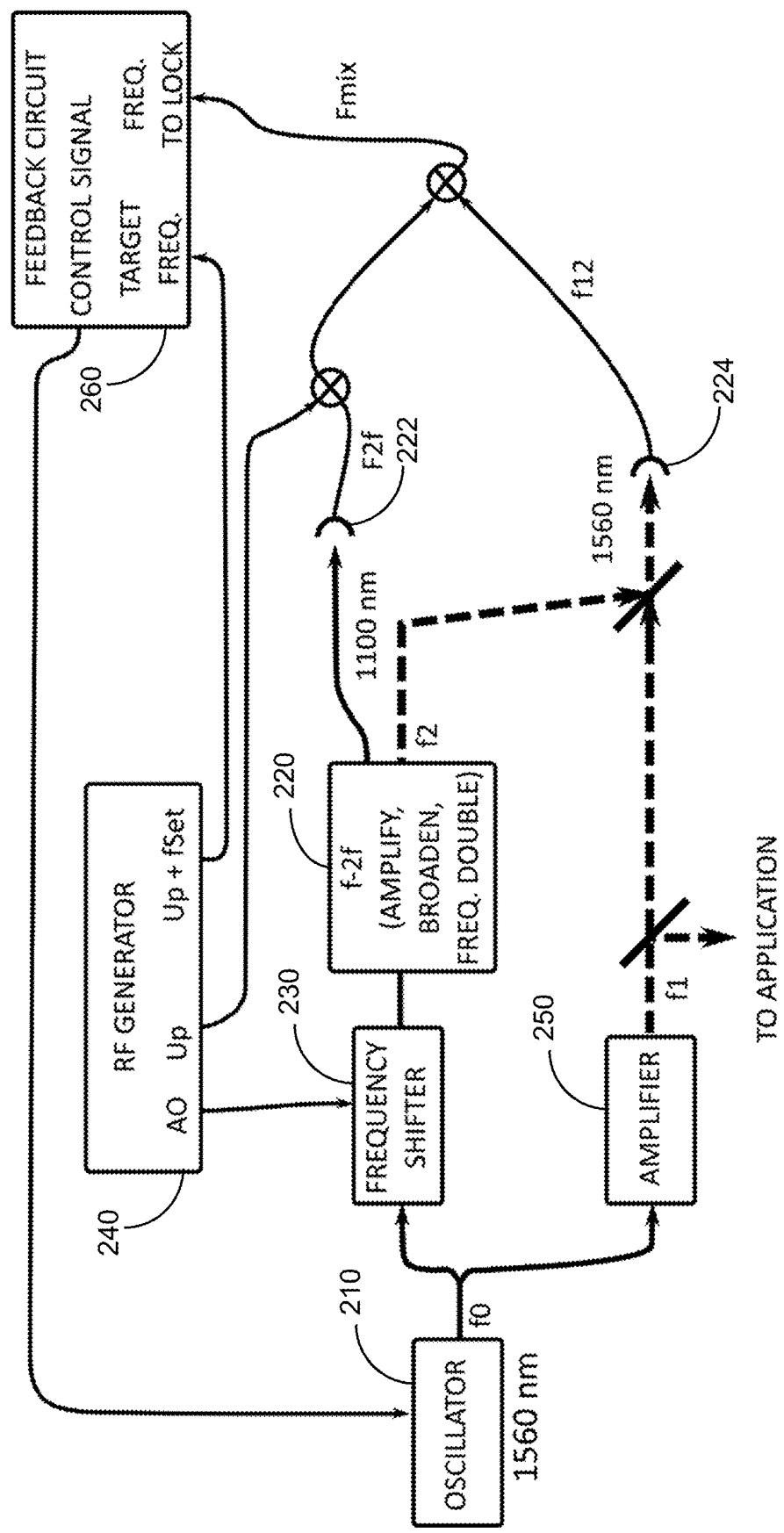
FIG. 8 shows an example system configured to control the carrier envelope frequency at the output of the example system of FIG. 5 in accordance with certain implementations described herein.

FIG. 8 shows an example system 200 configured to control the carrier envelope frequency at the output of the example pulse source 10 of FIG. 1 or FIG. 5 in accordance with certain implementations described herein. The example system 200 of FIG. 8 can be configured to stabilize the $f_{ceo}$ of the laser beam used in the application. Stabilization of $f_{ceo}$ can involve two branches, a diagnostic branch which has a harmonic f-2f interferometer generating an RF signal, and a branch which has the application beam to be stabilized, part of which is interfered with light from the diagnostic branch to generate a second RF signal. The RF signals can be combined to allow stabilization of $f_{ceo}$ to a desired frequency. A frequency shifter can be used to enable stabilization of $f_{ceo}$ to frequencies between zero and higher frequencies.

In FIG. 8, the oscillator 210 comprises an erbium oscillator 20 at 1560 nm and the other components shown in FIG. 1 or FIG. 5. The fiber pulse compressor 70 shown in FIG. 5 is optional and is not needed for carrier envelope offset frequency control. The oscillator 210 seeds an f-2f interferometer arm 220 that is preceded by an acousto-optic (AO) frequency shifter 230, which adds frequency "AO" to the optical comb lines (e.g., from an RF generator 240). The f-2f interferometer arm 220 can include an amplifier, spectral broadening (e.g., supercontinuum generation), a nonlinear crystal, and a spectral filter to generate an f-2f radio frequency signal (e.g., a beat note frequency "F2f" signal in the 1100 nm spectral range) which is detected by a photodetector 222. This signal can have the sum of the $f_{ceo}$ of the oscillator "$f_0$", the shifting frequency AO, and the phase drifts "$\varphi_1$" of the f-2f arm 220.

For example, in certain applications, it can be useful to have a zero or small $f_{ceo}$ to match changes in the carrier envelope phase to the application. In conventional f-2f interferometry, the frequency comb cannot be stabilized to a small frequency as the RF beat notes will appear near zero or multiples of the repetition rate. In certain implementations, shifting the comb by the frequency shifter before the f-2f interferometer arm 220 allows $f_{ceo}$ to be near zero while still providing a usable RF signal. In certain implementations, it can be advantageous to include the AO frequency shifter 230 and the f-2f arm 220 in a single module. In certain such implementations, the output after supercontinuum generation can be split into two arms (e.g., an IR arm and a near IR arm), where the AO frequency shifter 230 is only inserted into the near-IR arm and pulses from the IR arm are frequency doubled and interfered with the AO shifted pulses from the near IR arm to generate an f-2f signal which is frequency shifted by the AO modulation frequency (see, e.g., U.S. Pat. No. 8,442,373). Moreover, in certain such implementations, the f-2f arm 220 can also be configured to shift the $f_2$ frequency (or the 1560 nm output) by the modulation frequency of the AO modulator.

In certain implementations, a portion of the output from the oscillator 210 is amplified by the at least one amplifier 250 and is interfered with light from the f-2f interferometer arm 220, as schematically illustrated by FIG. 8. The amplified portion of the output can be near the original 1560 nm range of the oscillator 210, and is not otherwise used in the f-2f interferometer arm 220. The dashed lines in FIG. 8 indicate that these beams can propagate in free space to minimize carrier phase changes. These combined beams can be detected by a photodetector 224 which generates an RF beat note "$f_{12}$" signal that includes the difference of the $f_{ceo}$ of the two interferometer arms, $f_1$-$f_2$, where $f_1=f_0+AO+\varphi_1$, and $f_2=f_2+\varphi_2$, with $\varphi_2$ representing the phase drifts in the f-2f interferometer arm 220, such that $f_{12}=AO+\varphi_1-\varphi_2$.

In certain implementations, the signal F2f is electronically mixed with a radio frequency "Up" signal (e.g., from the RF generator 240) to generate a signal F2f+Up=$f_0$+AO+$\varphi_1$+Up. This "F2f+Up" signal can then be mixed with the "$f_{12}$" signal to get a difference signal with frequency $F_{mix}$=F2f+Up-$f_{12}$=$f_2$+Up. In certain implementations, a feedback circuit 260 is configured to lock the difference signal frequency $F_{mix}$ to frequency Up+$f_{Set}$ by controllably adjusting the actuator elements 110 of the adaptive fiber grating pulse stretcher 30 that controls the frequency comb. The feedback circuit 260 stabilizes $f_2$ to $f_{Set}$, which can be chosen by the user to obtain the desired $f_{ceo}$ value for the amplified application beam.

As schematically illustrated by FIG. 8, the example system 200 utilizes three generated radio frequencies. Two of the frequencies, Up and Up+$f_{Set}$, are well synchronized, as any drifts between the two affects $f_2$. For example, such synchronization can be easily achieved by sourcing both frequencies from the same device, or by synchronizing two RF generators to the same clock source. Locking stability is not very sensitive to frequency AO as AO is cancelled when mixing to generate $F_{mix}$.

In certain implementations, separating $f_{ceo}$ detection from the application beam (e.g., as in the example system 200 of FIG. 8) advantageously allows the application beam to be fully utilized for the application at hand. For example, the application interferometer arm can be used to generate outputs near 1400 nm and 1560 nm for precision metrology applications, outputs from 1560 nm to 1397 nm for coherence transfer, and outputs near 698 nm (after frequency doubling) and 1560 nm for beating with optical clock references, while the f-2f interferometer arm 220 generates the f-2f signal for stabilizing $f_{ceo}$ of the application arm without any non-common mode noise. Similarly, broadband output can be generated in the application interferometer arm in the range from 1050 nm to 1400 nm, which can allow coherence transfer between most optical clock wavelengths of interest and an optical clock reference near 1560 nm.

Figure 9:
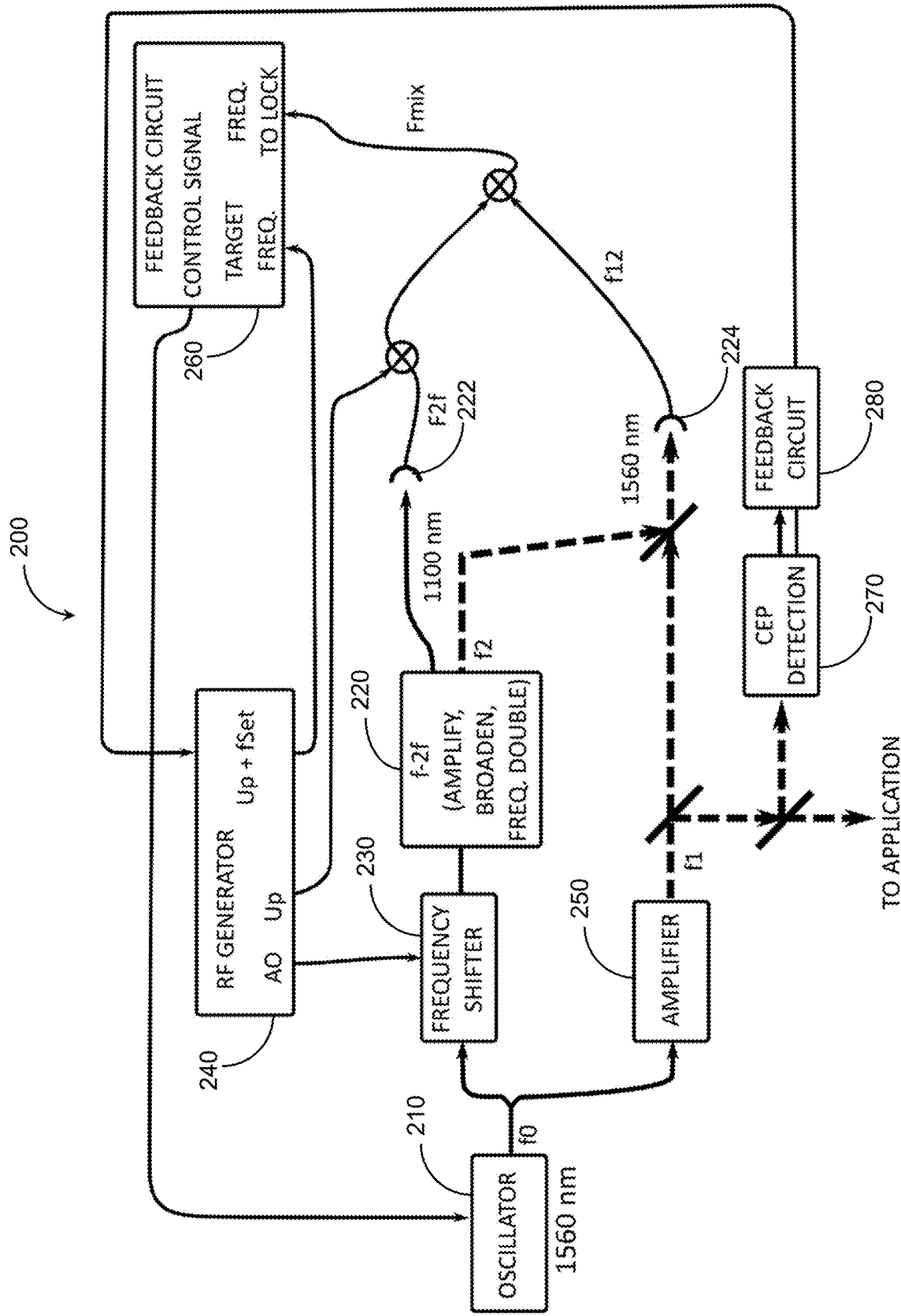
FIG. 9 shows an example system configured to control the carrier envelope phase at the output of the example system of FIG. 5 in accordance with certain implementations described herein.

FIG. 9 shows an example system 200 configured to control the carrier envelope phase at the output of the example pulse source 10 of FIG. 5 in accordance with certain implementations described herein. The example system 200 of FIG. 9 can be configured to achieve a specific carrier envelope phase. As schematically shown in FIG. 9, the example system 200 further comprises a carrier-envelope phase (CEP) detector 270 (e.g., a current in a semiconductor; stereo above-threshold-ionization system, spectrally-resolved f-2f interferometer, or directly from the CEP sensitive application (see, e.g., K. Wang et al., "Comb offset frequency measurement using two-photon—three-photon quantum interference control," CLEO 2017, JTh2A.68.pdf; T. Fordell et al., "High-speed carrier-envelope phase drift detection of amplified laser pulses," Op. Express, Vol. 19, No. 24, pp. 23652-23657 (2011); E. Shestaev et al., "High-power ytterbium-doped fiber laser delivering few-cycle, carrier-envelope phase-stable 100 μJ pulses at 100 kHz," Op. Lett. Vol. 45, No. 1, pp. 97-100 (2020))) and a feedback circuit 280 configured to receive a signal from the CEP detector 270. For example, to maintain a constant CEP, the feedback circuit 280 can be configured to control the frequency $U\rho + f_{Set}$, effectively adjusting $f_{Set}$ in such a way as to maintain the desired CEP.

Figure 10:
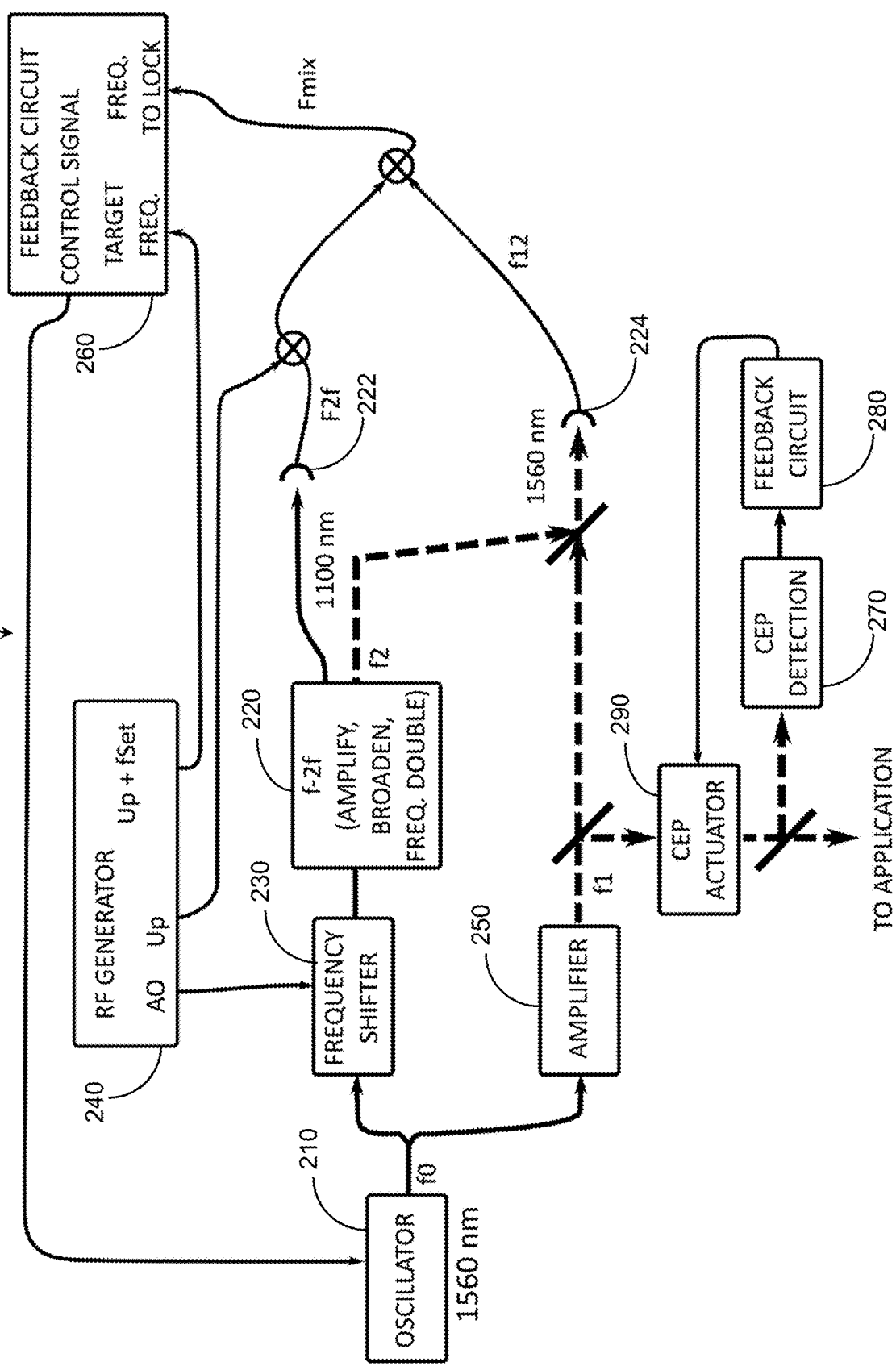
FIG. 10 shows another example system configured to control the carrier envelope phase at the output of the example system of FIG. 5 in accordance with certain implementations described herein.

FIG. 10 shows another example system 200 configured to control the carrier envelope phase at the output of the example pulse source 10 of FIG. 5 in accordance with certain implementations described herein. The example system 200 of FIG. 10 further comprises at least one CEP actuator 290 (e.g., a rotating transparent plate of material, such as glass, having low chromatic dispersion and/or laser pump intensity control) in the laser output and configured to receive a signal from the CEP feedback circuit 280. Certain such implementations advantageously allow the CEP stabilization to operate independently of the $f_2$ stabilization system, which locks $f_2$ to zero, while using CEP stabilization to compensate for drifting of the CEP.

As schematically illustrated by FIGS. 9 and 10, the CEP detector 270 of certain implementations receives light being sampled by a beam splitter. In certain such implementations, the CEP detector 270 preferentially measures light with the same CEP as the application sees. If certain other implementations, a calibration can be performed by simultaneously comparing the measured CEP at the CEP detector 270, and at the application.

Other Example Implementations

In certain implementations, the pulse source 10 utilizes at least one pulse compressor 50 comprising at least one chirped fiber grating pulse compressor 50 (e.g., chirped FBG compressor) in which pulses are subject to significant levels of SPM (e.g., SPM greater than 1, greater than π, greater than 3π, or larger). The pulse source 10 can use relatively long FBG compressor gratings while still obtaining a high level of pulse quality at the output. In certain implementations, the chirped fiber grating pulse compressor 50 can be configured to stretch input pulses to have a pulse width greater than or equal to 100 ps or a pulse width greater than or equal to 1 ns. With increasing length, the level of SPM in the chirped fiber grating pulse compressor 50 also increases.

In certain implementations, the pulse source 10 utilizes compact high power pulse sources based on Tm and Ho fiber amplifiers. In certain such implementations, the fiber grating pulse compressor 50 comprises longer FBG lengths configured to provide efficient pulse compression due to the reduced refractive index modulation that is currently available for FBGs operating at wavelengths greater than 1.7 microns.

In certain implementations, the pulse source 10 utilizes coherent combination of pulses or pulse stacking in pulse stackers to increase the pulse energy of the few cycle pulse system (see, e.g., U.S. Pat. Appl. Publ. No. 2019/0190224 which is incorporated in its entirety by reference herein). In certain such implementations with an optimized pulse stacking system, the pulse energy of few cycle pulses can be increased by at least a factor of 10 or more, where sub-10 fs pulses can also be reached.

Figure 11:
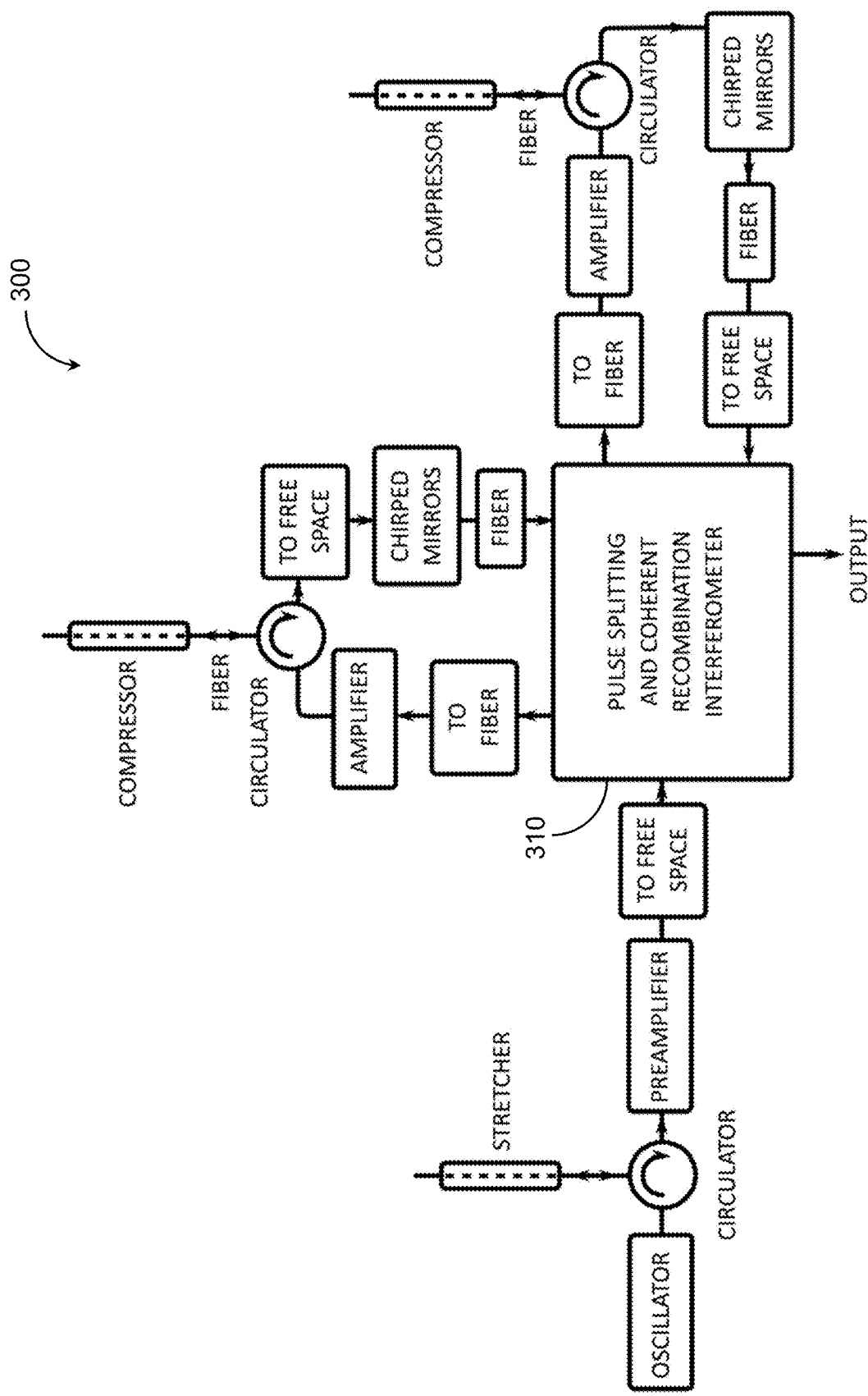
FIG. 11 schematically illustrates an example high energy few cycle pulse generation system further comprising coherent addition of individual pulses in accordance with certain implementations described herein.

FIG. 11 schematically illustrates an example high energy few cycle pulse generation system 300 further comprising coherent addition of individual pulses in accordance with certain implementations described herein. In certain implementations, the system 300 comprises a coherent combination interferometer 310 configured to receive amplified seed pulses from an amplifier, the coherent combination interferometer 310 configured to multiply each pulse into two trains of temporally separated sub-pulses. Each train of the two trains seeds one of two amplifiers, with each pulse becoming a few cycle, high energy pulse. The coherent combination interferometer 310 is further configured to recombine these two trains of amplified pulses into a single output pulse with pulse energy several times higher than each individually amplified pulse in the train. For example, the system 300 can be configured to yield a scaling of the average power from a single amplifier by the number of amplifiers combined (e.g., two as shown in FIG. 11) and a scaling of the pulse energy from a single amplifier by the total number of sub-pulses generated from each seed pulse (e.g., 8 or 16).

In certain implementations, the example few cycle pulse system 300 of FIG. 11 is configured to generate pulse energies in the range of 100 nJ to 100 μJ per pulse or higher. The carrier wavelength of certain implementations can be at or near 1.55 microns, in a range of 1.8 microns to 2.1 microns, or in a range of 900 nm to 1100 nm, with pulse widths of 10 fs or lower. Certain such implementations are configured for use in machining applications. In some applications, solid state laser sources can also be pulse compressed using nonlinear FBGs in accordance with certain implementations disclosed herein. Certain implementations achieve even higher pulse energies by using nonlinear volume Bragg gratings for compression, where adaptive control of the characteristics of the at least one pulse stretcher 30 can compensate for nonlinear pulse distortions in the volume Bragg gratings.

Certain implementations described here are configured to be used for efficient THz generation, as well as for direct electric field sampling. The broadband high power supercontinuum frequency comb spectra generated by the pulse sources 10 of certain implementations can further be amplified in optical parametric amplifiers where output levels for frequency combs in the range of 100 mW to 1 W or higher can be generated in the mid-IR.

In certain implementations configured for use for coherence transfer, the pulse source 10 can provide a frequency transfer stability between the visible and the IR (e.g., in a range of 698 nm to 1550 nm) of less than $10^{-18}$ in one second, which can be used for precision coherence transfer for precision optical clocks and is better than the stability achievable with other technologies. Certain implementations disclosed herein can be configured, in conjunction with high harmonic generation in gases or from solids, to provide a relatively simple system for efficient VUV light generation (e.g., wavelengths of 100 nm and shorter).

In certain implementations, the system 200 shown in FIG. 8 is configured for precision frequency metrology and coherence transfer with highly nonlinear waveguides, such as silicon nitride ($Si_3N_4$), here simplified as SiN. Highly nonlinear waveguides are useful for octave spanning supercontinuum generation with pulse energies of only a few pJ. However, due to the lack of an intrinsic second order nonlinearity in SiN, it can be difficult to design SiN waveguides that allow for frequency doubling, as utilized by an f-2f interferometer. In certain implementations, the system 200 shown in FIG. 8 can be adapted to precision metrology, where a single oscillator feeds two supercontinuum generating SiN waveguides, the first SiN waveguide used for coherence transfer between spectral regions and the second SiN waveguide used as an f-2f interferometer via inserting a doubling crystal down-stream of the SiN waveguides. Additional microwave components, as discussed with respect to FIG. 8, can also be used to ensure minimal frequency noise between the various spectral components.

Figure 12:
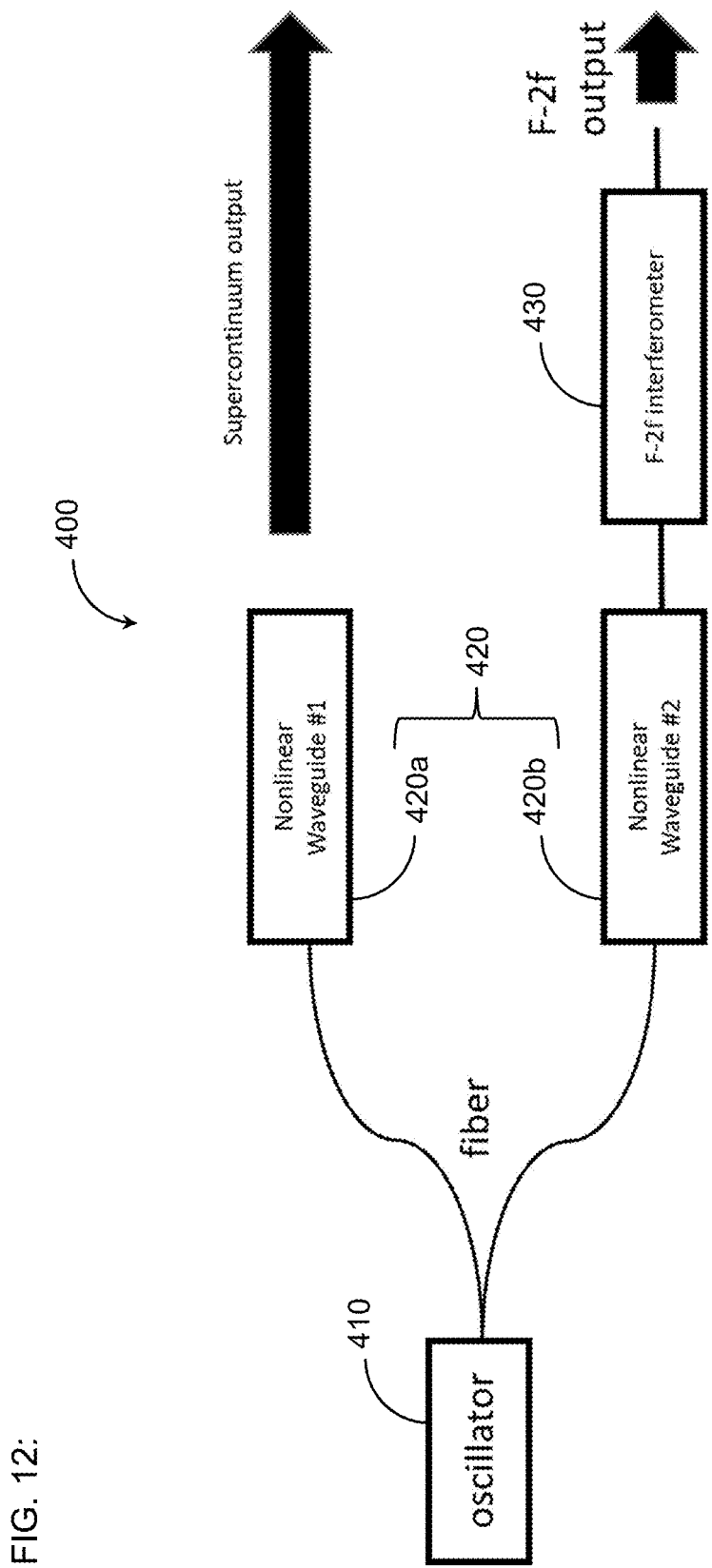
FIG. 12 schematically illustrates an example precision comb system with two highly nonlinear waveguides for supercontinuum generation in accordance with certain implementations described herein.

FIG. 12 schematically illustrates an example precision (e.g., low noise) comb system 400 with two highly nonlinear waveguides for supercontinuum generation in accordance with certain implementations described herein. In certain implementations, the comb system 400 comprises an oscillator 410 configured to generate an output that is split in two (e.g., by an optical coupler). After optional amplification (not shown) of the split beams, the two beams are coupled into two highly nonlinear waveguides 420 for supercontinuum generation. A first nonlinear waveguide 420a of the two highly nonlinear waveguides 420 is configured to generate supercontinuum output that is subsequently interfered with optical references (not shown) for the generation of beat signals. A second nonlinear waveguide 420b of the two highly nonlinear waveguides 420 is configured to be used in conjunction with a frequency doubling crystal 430 (e.g., periodically poled nonlinear lithium niobate (PPLN)) for the generation of an F-2f signal.

Certain implementations described herein have other benefits, for example, few cycle pulse and mid-IR pulse generation that are compatible with dual comb generation in a single laser cavity (see, e.g., U.S. Pat. No. 5,479,422). Certain implementations described herein are configured to be further adapted for scanning dual comb systems for mid-IR spectroscopy and other applications (see, e.g., U.S. Pat. No. 8,120,778). Other certain implementations of the few cycle pulse sources as described herein are configured to be used with single oscillator dual comb generation and dual comb scanning.

Certain implementations described herein are configured to be used with pulse compression in gas-filled nonlinear hollow waveguides (see, e.g., J. S. Travers et al., "High-energy pulse self-compression and ultraviolet generation through soliton dynamics in hollow capillary fibres," Nature Photonics, Vol. 13, 547 (2019)).

Figure 13:
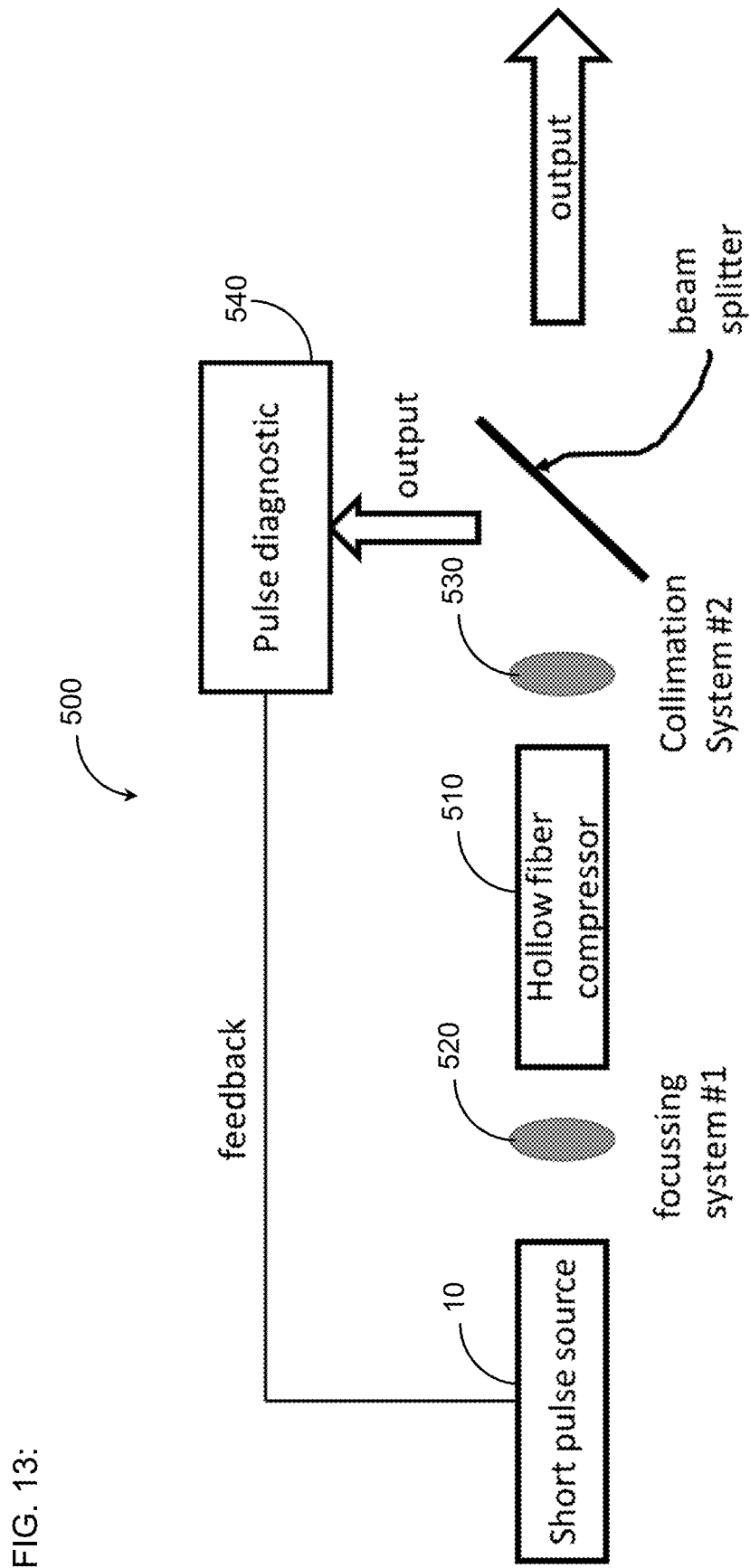
FIG. 13 schematically illustrates an example adaptive short pulse generation system comprising a hollow fiber compressor in accordance with certain implementations described herein.

FIG. 13 schematically illustrates an example adaptive short pulse generation system 500 comprising a hollow fiber compressor 510 in accordance with certain implementations described herein. The system 500 comprises a short pulse source 10 (e.g., as schematically illustrated by FIG. 1) and a hollow fiber compressor 510 (e.g., a hollow photonic crystal fiber; a Kagome fiber; a hollow capillary) that is filled with gas (e.g., at least one inert gas; He; Ne; Kr; Ar) at high pressures (e.g., in a range from 2 bar to 100 bar). In certain implementations, pulses from the short pulse source 10 (e.g., with pulse energies in the range of 100 nJ to a few 100 µJ) are transmitted into the hollow fiber compressor 510 (e.g., via a focusing system 520) and the hollow fiber compressor 510 is configured to compress the femtosecond input pulses to a few cycles. As schematically illustrated by FIG. 13, the output of the hollow fiber compressor 510 is collimated by a collimation system 530 and a first portion of the collimated output is directed to a pulse diagnostic system 540 which generates a feedback signal provided to the adaptive gratings of the pulse source 10 (e.g., for optimizing the pulse quality at the output). In certain implementations, the example system 500 of FIG. 13 advantageously tolerates (e.g., is not substantially affected by optical damage) much higher pulse energies and peak powers than are tolerated by pulse sources utilizing pulse compression in a solid core fiber (see, e.g., FIG. 5).

Certain implementations described herein utilize Yb fiber based pulse sources (see, e.g., U.S. Pat. Nos. 7,688,499 and 9,553,421, each of which is incorporated by reference herein) and are configured to ensure a high optical efficiency of the system. Certain such pulse sources utilize dispersive pulse stretching and pulse compression elements which can be constructed with adaptive control of the dispersion characteristics. In certain implementations, more than one adaptively controlled FBG can be used in such pulse sources.

Pulse Transformation

In certain implementations, the dispersion modulation enabled by an adaptively controlled FBG (e.g., as schematically illustrated by FIGS. 1, 2, 5 and 13) can also be used for shaping the amplitude of optical pulses or, more generally, for transforming the amplitude and/or phase of optical pulses. This functionality can be particularly advantageous for controlling the pulse amplitude of pulses entering a nonlinear optical element (e.g., the optical fiber pigtail 60a in FIG. 1). Though the dispersive modulation imprinted onto the stretched pulses by adaptive fiber stretcher 30 in FIG. 1 can be small, after compensation of the dispersion of pulse stretcher 30 with the near-opposite dispersion of the pulse compressor 50, the dispersive modulation can translate to amplitude modulation.

Figure 14:
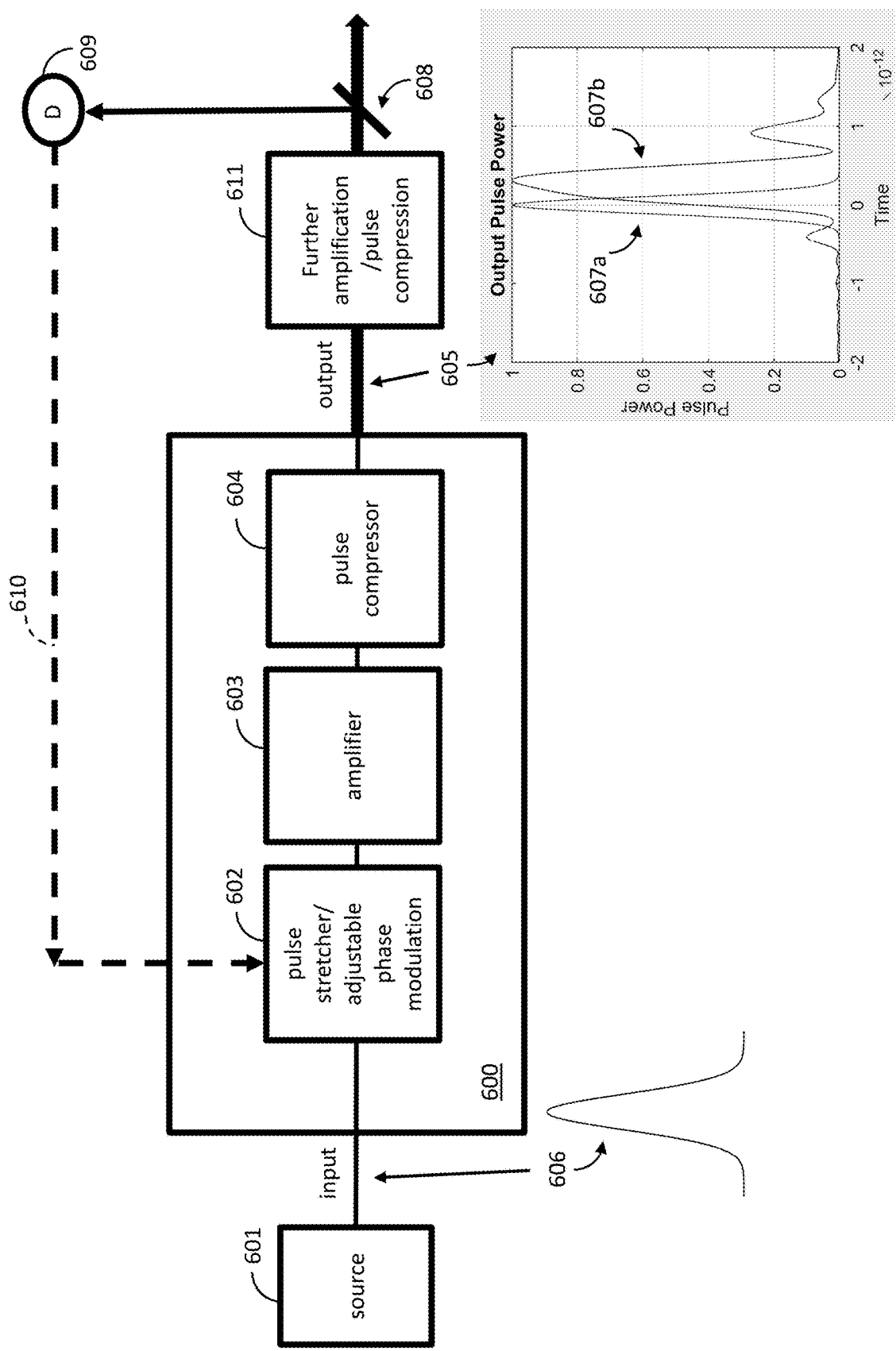
FIG. 14 schematically illustrates an example adaptive short pulse transformer system in accordance with certain implementations described herein.

FIG. 14 schematically illustrates an example adaptive short pulse transformer system utilizing this principle in accordance with certain implementations described herein. As schematically illustrated in FIG. 14, a pulse transformer 600 can be seeded by a short pulse source 601, and the pulse transformer 600 can comprise a first dispersive element 602 configured for pulse stretching and adjustable phase modulation which can modulate a first dispersion of the first dispersive element 602. The first dispersive element 602 of certain implementations comprises an adaptively controlled FBG, as discussed herein with respect to FIG. 2, while in certain other implementations, the first dispersive element 602 further comprises additional dispersive components (e.g., dispersive fiber or bulk dispersive optics). The pulse transformer 600 can further comprise at least one optical amplifier 603 which can have a gain of unity or higher.

The pulse transformer 600 can further comprise a second dispersive element 604, the second dispersive element 604 having a second dispersion opposite to the first dispersion of the first dispersive element 602. For example, the absolute value of the first dispersion and the absolute value of the second dispersion can be substantially equal to one another, with the first dispersion and the second dispersion having opposite signs from one another. For another example, the absolute value of at least the second-order dispersion component $D_{21}$ of the first dispersive element 602 (e.g., pulse stretcher) and the absolute value of at least the second-order dispersion component $D_{22}$ of the second dispersive element 604 (e.g., pulse compressor) are substantially equal to one another (e.g., $|D_{21}|$ substantially equal to $|D_{22}|$ to within 50%, to within 10%, or to within 1%), with at least the second-order dispersion component $D_{21}$ of the first dispersive element 602 and at least the second-order dispersion component $D_{22}$ of the second dispersive element 604 having opposite signs from one another. In certain implementations, the second dispersive element 604 comprises an FBG, while in certain other implementations, the second dispersive element 604 further comprises additional bulk optic or dispersive fiber elements. In certain implementations, a dispersion of the at least one optical amplifier 603 can be considered to be a part of the dispersion of the second dispersive element 604. In certain implementations, the pulse compression FBG can also be provided with adjustable phase modulation, which can modulate the dispersion of the second dispersive element 604 and optimize the pulse quality after compression.

Trace 606 of FIG. 14 schematically represents the pulse intensity versus time for the short input pulses entering the pulse transformer 600 from the source 601. Trace 607a of the inset plot of FIG. 14 shows the pulse power as a function of time for an example input (e.g., short) pulse entering the pulse transformer 600 and trace 607b of the inset plot of FIG. 14 shows the pulse power as a function of time for an example output (e.g., long) pulse leaving the pulse transformer 600 at output 605. Traces 607a, 607b were calculated using the dispersion profile parameters shown in FIG. 3 and with nearly matched second-order dispersion values of the first dispersive element 602 (e.g., pulse stretcher) and the second dispersive element 604 (e.g., pulse compressor), as shown in FIG. 1. In certain implementations, additional dispersive and nonlinear optical elements (e.g., as shown in FIG. 1) are configured to ensure that the final output pulse is obtained with high quality.

In certain implementations, for the pulse transformer 600 to provide amplitude and phase shaping of an input pulse or to effectively convert dispersion to amplitude modulation, the absolute value of the second-order dispersion components of all the pulse stretching elements (e.g., elements having positive dispersion; comprising an FBG stretcher) of the pulse transformer 600 is matched (e.g., substantially equal) to within 50% (e.g., within 10%; within 1%) of the absolute value of the second-order dispersion components of all the pulse compressing elements (e.g., elements having negative dispersion; comprising an FBG compressor) of the pulse transformer 600. In certain such implementations, the pulse transformer 600 is configured to effectively convert dispersion modulation to amplitude modulation or to generally function via phase to amplitude conversion.

In certain implementations, optional pulse stretching, amplification, and pulse compression stages can be included down-stream of output 605 for further pulse manipulation. These stages can comprise standard fiber or bulk optic components, as well known in the state of the art and are not further shown here.

To add an adaptive functionality to pulse transformer 600, a small fraction of the light from output 605 can be directed (e.g., via beam splitter 608) to a pulse diagnostic element 609. For example, the pulse diagnostic element 609 can comprise an autocorrelator, a frequency-resolved gating instrument, and/or other devices (e.g., as previously discussed with respect to FIGS. 1, 2 and 13). Appropriate control signals can then be generated based on signals from the pulse diagnostic element 609 and the control signals can be delivered (e.g., via electrical connection 610) to the adjustable first dispersion element 602 or the adjustable dispersion element 604. To enhance the sensitivity of the pulse diagnostic element 609, certain implementations include an additional pulse compression stage 611 up-stream of the beam splitter 608, as schematically illustrated by FIG. 14. This pulse compression stage 611 can include nonlinear optical elements, dispersive elements, and optical amplifiers.

In certain implementations, the pulse transformer 600 is configured to generate pulse shapes that are robust against to pulse break-up during pulse propagation in the presence of nonlinearity (i.e., self-phase modulation) in the pulse compression stage 611. For example, the pulse transformer 600 can be configured to generate chirped pulses with a near parabolic shape, which, during nonlinear pulse propagation, are particularly robust against pulse break-up, both in positive and negative dispersion fiber (see, e.g., U.S. Pat. Nos. 9,553,421 and 10,096,962). Certain implementations described herein advantageously accomplish pulse transformation in a more compact form factor than do the configurations of U.S. Pat. Nos. 9,553,421 and 10,096,962 and without constraints on fiber lengths, amplification values, or dispersion parameters of the fibers involved. This additional flexibility can be partially facilitated via the use of the adjustable and adaptive pulse transformer 600 of certain implementations described herein.

In certain implementations, adaptive control of the pulse shape by the pulse transformer 600 produces pulses with a reduced pulse curvature near the center of the pulse, which can propagate along long fiber lengths while avoiding pulse break-up. As used herein, pulse curvature (PC) can be defined as the time derivative of the pulse slope: $PC=d^2I(t)/dt^2$, where $I(t)$ is the pulse intensity as a function of time t. Generally, any physically possible pulses exhibit a constant PC at the highest pulse intensity, whereas PC typically decreases towards the periphery of the pulses. Pulses with a gaussian or $sech^2$ pulse profile are well known examples of such pulses. In contrast, for parabolic pulses, PC is constant over most of the extent of the pulse, which can produce a particularly stable pulse in the presence of nonlinear pulse propagation. In general, there is a continuum of different pulse shapes ranging from $sech^2$ to gaussian to parabolic. For example, quartic solitons (e.g., as recently described by A. F. J. Runge et al., "The pure-quartic soliton laser," arXiv: 1910.10314, 2019) can also be particularly stable in the presence of nonlinear pulse propagation. For certain implementations described herein, pulses with a reduced pulse curvature can be defined as near parabolic pulses that have a reduced PC compared to a standard Gaussian or $sech^2$ pulses for the same 1/e pulse width (e.g., temporal separation of the points where the pulse intensity decreases to 1/e compared to the peak intensity). This definition also includes quartic soliton pulses under the more general heading of near-parabolic pulses. Other pulse forms that fall within this definition include pulses that have a time-dependent intensity profile that resembles at least partially Jacobi elliptic functions (e.g., the sn Jacobi elliptic function), which can also have a reduced PC near the center of the pulse.

Apart from the generation of near parabolic pulses via the adaptively controlled pulse transformer 600 in accordance with FIG. 14, as discussed here, near parabolic pulses can also be generated via nonlinear amplification in positive dispersion fiber amplifiers (see, e.g., U.S. Pat. No. 8,031, 396). In certain implementations, a pulse transformer can comprise a negative dispersion fiber that is configured to receive a stretched pulse, where the pulse transformer is configured to generate near parabolic pulses from an input pulse. In certain such implementations, the stretched pulses are then submitted to some nonlinearity or to self-phase modulation (e.g., self-phase modulation values less than 10) in a negative dispersion fiber (e.g., using an amplifier), and are recompressed to close to the bandwidth limit. The final pulse can resemble a near parabolic pulse shape.

Figure 15:
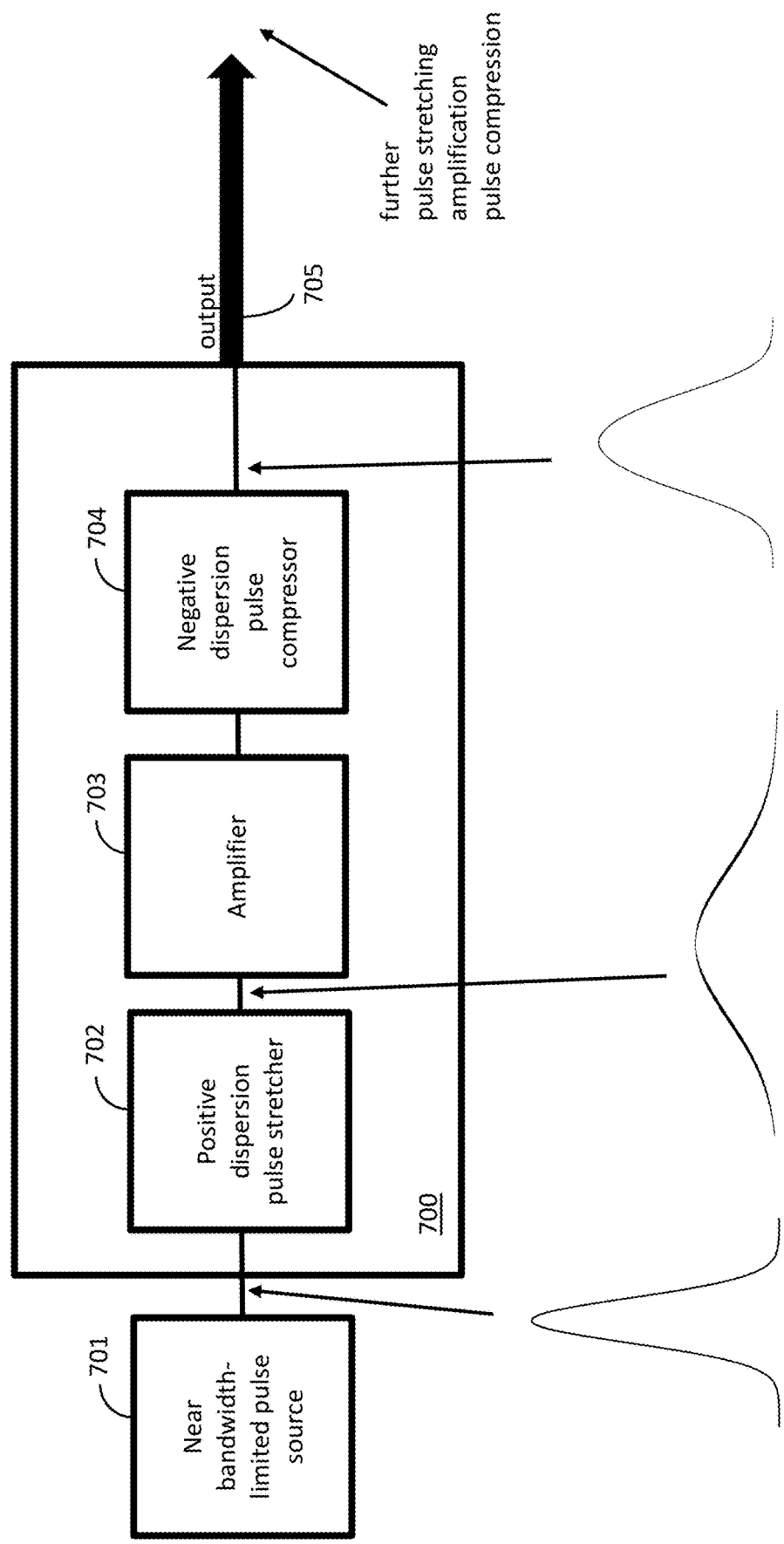
FIG. 15 schematically illustrates an example substantially static and near-parabolic short pulse transformer in accordance with certain implementations described herein.

FIG. 15 schematically illustrates an example substantially static and near-parabolic short pulse transformer 700 (e.g., a pulse transformer generating near-parabolic pulses) in accordance with certain implementations described herein. The pulse transformer 700 comprises a first dispersive element 702 with a positive second-order dispersion component $D_{21}$ (e.g., optical pulse stretcher) configured to receive near-bandwidth limited pulses generated by a pulse source 701 and to stretch the received pulses. The pulse transformer 700 further comprises a fiber amplifier 703 configured to subject the stretched pulses to self-phase modulation and a second dispersive element 704 (e.g., pulse compressor) having a second-order dispersion component $D_{22}$ substantially opposite to a second-order dispersion component $D_{21}$ of the first dispersive element 702, the second dispersive element 704 configured to compress (e.g., recompress) the stretched pulses. In certain implementations, the amount of self-phase modulation in the fiber amplifier 703 can be small compared to the self-phase modulation induced by an additional negative dispersion fiber (not shown) in optical communication with the fiber amplifier 703. The pulse transformer 700 is configured to generate near parabolic pulses at the output 705. In FIG. 15, the arrows point to the positions along the pulse transformer 700 at which the respective pulse forms are observable. In certain other implementations, optional pulse stretching, amplification, and pulse compression stages (e.g., fiber or bulk optic components) can also be included down-stream of output 705 for further pulse manipulation.

Certain implementations in accordance with FIG. 15 are nearly static in that certain such implementations do not include adaptive control of the pulse shape (e.g., in contrast to certain implementations in accordance with FIG. 14), or include only very limited adaptive control (e.g., via changing the amplifier or the optical powers of the seed pulses from the pulse source 701). Thus, the pulse transformer 700 of FIG. 15 can be simpler than the pulse transformer 600 of FIG. 14 or the pulse source 10 of FIG. 1. The pulse transformer 700 of certain implementations can also allow for the generation of high energy pulses in the presence of large values of self-phase modulation (e.g., self-phase modulation values greater than or equal to 3).

Referring back to FIG. 14, in certain implementations, dispersion modulation in an adaptive pulse transformer 600 can also modify or modulate the amplitude of the stretched pulse, which via self-phase modulation in the stretched pulse can allow for compensation of higher-order dispersion terms (e.g., as encountered in a high power chirped pulse amplification system, as discussed in U.S. Pat. Nos. 6,885,683 and 10,096,962).

Generally, the pulse transformers as discussed herein with respect to FIGS. 1, 14, and 15 can be configured to: (i) subject a stretched pulse to self-phase modulation; (ii) implement amplitude shaping of a stretched pulse via dispersion modulation of the corresponding fiber Bragg grating stretcher (e.g., as discussed herein); (iii) implement amplitude shaping via phase to amplitude conversion (e.g., as discussed herein with respect to FIG. 14); and (iv) implement amplitude shaping via subjecting a stretched pulse to self-phase modulation in conjunction with compressing the stretched pulse back to near the transform limit (e.g., as discussed herein with respect to FIG. 15). In certain implementations, these four types of pulse transformation can be utilized at the same time to obtain optimum results. For example, such pulse transformers can optimize the output pulse quality of a high power amplifier system in the presence of self-phase modulation and non-compensated dispersion. In certain implementations, such pulse transformers can rely on both modulation of amplitude and phase of an input pulse. FBG pulse stretchers or FBG pulse compressors are particularly useful elements of such pulse transformers in accordance with certain implementations described herein by facilitating both amplitude and phase shaping of an input pulse (e.g., as discussed herein with respect to FIG. 14). Alternatively, a pulse transformer of certain other implementations can be non-adaptive and can rely on subjecting stretched pulses to self-phase modulation (e.g., as discussed herein with respect to FIG. 15). Certain implementations that utilize pulse manipulation as described herein (e.g., as discussed with respect to FIGS. 3 and 4), sub 200 fs pulses (e.g., sub 100 fs pulses) can be generated from an Er-fiber amplifier system with a pulse energy >30 nJ (e.g., a pulse energy >50 nJ; a pulse energy >100 nJ). In certain implementations, the average power of the Er-fiber amplifier system can be greater than 3 W (e.g., greater than 5 W; greater than 10 W).

In certain implementations (e.g., using configurations schematically illustrated by FIG. 1, 2, 5, 14, or 15), the dispersion mismatch between the at least one pulse stretcher 30 (e.g., first dispersive element 602, 702) and the at least one pulse compressor 50 (e.g., second dispersive element 604, 704) is increased to increase the pulse energies that are generated. Certain such implementations can produce a longer and more strongly chirped pulse that enters the optical fiber pigtail 60a and thus increases the pulse energy limits for spectral bandwidth broadening in the optical fiber pigtail 60a. In certain implementations, the pulses are compressed back to near the bandwidth-limit (e.g., using a prism, grism, or grating compressor), with larger dispersion values than are provided with chirped mirrors. In certain implementations, the first dispersive element 602, 702 and/or the second dispersive element 604, 704 comprise volume Bragg gratings and/or bulk stretchers and compressors instead of fiber Bragg grating stretchers and compressors.

In certain implementations (e.g., using configurations schematically illustrated by FIG. 1, 2, 5, 14, or 15), to increase the pulse energies that are generated, the optical fiber pigtail 60a comprises a large mode area fiber (e.g., having larger mode sizes than standard optical fibers) instead of a standard nonlinear optical fiber. Alternatively, in certain implementations, the optical fiber pigtail 60a comprises other fiber types (e.g., fluoride fibers, chalcogenide fibers, gas-filled hollow core fibers). Optical bandwidth broadening and pulse compression in such structures can be advantageously implemented in certain implementations by using chirped near parabolic pulse forms for pulse compression, which can be generated, for example, via the pulse transformers as discussed here. Since near parabolic pulse compression utilizes stretched pulses in the bandwidth-broadening stage and further utilizes a final compression stage to obtain short pulses (e.g., the shortest possible pulses), the peak pulse power during bandwidth broadening and propagation through the fiber in certain implementations is reduced (e.g., allowing for the generation of higher energy pulses in such fibers as compared to the use of soliton compression). In soliton compression, a high peak power pulse is generated within the actual bandwidth broadening fiber. Utilizing parabolic pulse compression in certain implementations can thus overcome optical damage limitations in optical fibers or can reduce the onset of gas ionization in gas-filled hollow core fiber compression, which can otherwise reduce the pulse quality of hollow fiber compressors.

Figure 16:
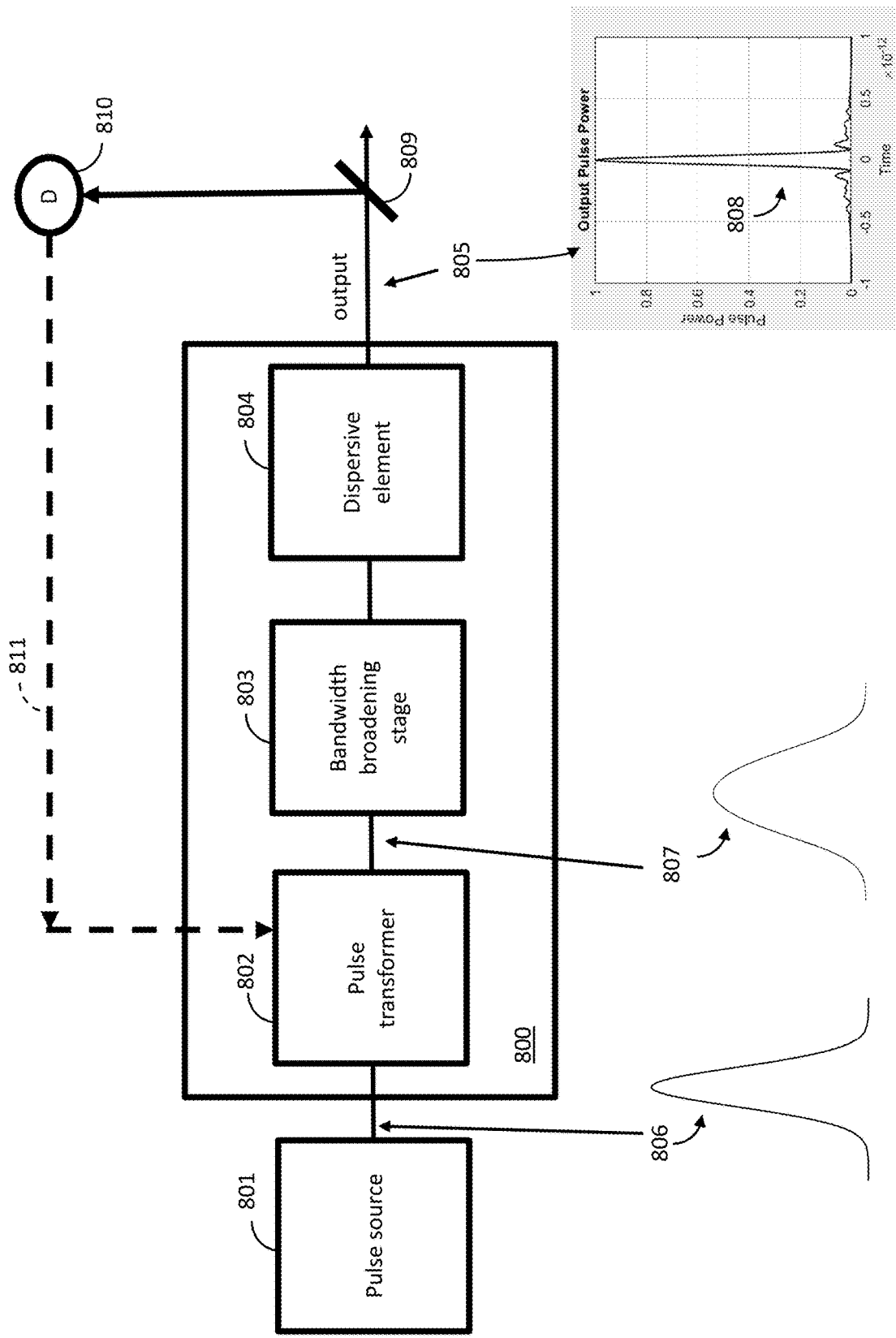
FIG. 16 schematically illustrates an example application of an adaptive short pulse parabolic pulse compressor of high energy pulses in accordance with certain implementations described herein.

FIG. 16 schematically illustrates an example application of an adaptive short pulse near parabolic pulse compressor 800 of high energy pulses in accordance with certain implementations described herein. The pulse compressor 800 of FIG. 16 is configured to receive a short pulse from the source 801 (e.g., near transform limited).

The pulse compressor 800 of FIG. 16 comprises a pulse transformer 802 (e.g., pulse transformers 600, 700) configured to transform the optical pulse to a near parabolic pulse shape. The pulse transformer 802 of certain implementations comprises at least one chirped fiber Bragg grating with adaptive dispersion control. As discussed herein with respect to FIGS. 14 and 15, the pulse transformer 802 can comprise appropriate pulse stretching and compression stages as well as amplification stages. Adaptive control can be implemented in either of or both the pulse stretching and compression stages. In certain implementation, the pulse transformer 802 can comprise at least one fiber selected from the group consisting of: telecom fiber, large mode area fiber, fluoride, lead glass, telluride, chalcogenide or any soft-glass fiber, waveguides, gas-filled hollow core fiber, as well as a nonlinear optical element inserted into multi-pass cell. In all generality, the components of the group listed above can have positive or negative dispersion. When comprising a positive dispersion nonlinear element, the pulse transformer 802 of certain implementations can provide additional flexibility (e.g., compared to U.S. Pat. Nos. 6,885,683 and 10,096,962). In certain implementations in which the source 801 comprises a solid-state laser pulse source, the pulse transformer 802 can comprise a bulk optical pulse shaper (see, e.g., F. Verluise et al., "Amplitude and phase control of ultrashort pulses by use of an acousto-optic programmable dispersive filter: pulse compression and shaping," Opt. Lett., 25, 575 (2000)) and the pulse compression with parabolic pulses can be extended to pulses with pulse energies beyond 1 mJ.

The pulse compressor 800 of FIG. 16 further comprises a nonlinear bandwidth broadening stage 803 with negative dispersion and configured to receive the near parabolic pulse from the pulse transformer 802. The bandwidth broadening stage 803 can comprise at least one fiber selected from the group consisting of: negative dispersion telecom fiber, large mode area fiber, fluoride, lead glass, telluride, chalcogenide or any soft-glass fiber, any negative dispersion waveguide, gas-filled hollow core fiber operating in the negative dispersion regime, as well as a nonlinear optical element inserted into multi-pass cell (see, e.g., J. Weitenberg et al., "Multi-pass-cell-based nonlinear pulse compression to 115 fs at 7.5 µJ pulse energy and 300 W average power," Opt. Lett., 25, 20502 (2017)). In certain implementations, using the near parabolic pulses for pulse compression advantageously reduces the peak power inside the bandwidth broadening stage 803 and/or applies the compression to nonlinear optical materials operating at wavelengths greater than or equal to 1.5 µm, where the majority of high quality optical materials have negative dispersion.

The pulse compressor 800 of FIG. 16 further comprises a dispersive element 804 (e.g., pulse compressor) configured to compress (e.g., recompress) the pulses received from the bandwidth broadening stage 803 (e.g., to close to the bandwidth limit), and to emit the resulting pulses at an output 805. In certain implementation, the dispersive element 804 can comprise at least one element selected from the group consisting of: a chirped mirror pair; a bulk compressor assembled from bulk gratings, grisms, or prisms; a volume Bragg grating, a piece of bulk optical material.

As schematically illustrated in FIG. 16, trace 806 represents the short near bandwidth-limited pulse at the input to the pulse compressor 800, trace 807 represents the near parabolic pulse shape obtained at the output of the pulse transformer 802, and trace 808 represents the compressed pulses generated at the output 805.

In certain implementations, additional pulse compression stages can be included downstream of outputs 605, 705, 805 (referring to FIGS. 14, 15 and 16). These additional pulse compression stages can be used to compress the output pulses to the few cycle regime (e.g., as discussed herein with respect to FIG. 5).

High Power Oscillators

High power fiber amplifier systems (e.g., the example pulse sources 10 schematically illustrated in FIGS. 1 and 5) can have a relatively high component count, since compact mode-locked fiber oscillators (e.g., as used for frequency combs) typically only generate a few hundred pJ of pulse energy. Hence, such high power fiber amplifier systems can utilize several amplifier stages, including several isolators, optical pump couplers, etc. For example, mode-locked fiber oscillators that operate close to zero intra-cavity dispersion that generally exhibit the lowest pulse jitter and the lowest carrier phase noise cannot be operated at pulse energies exceeding about 1 nJ without great experimental difficulty.

In contrast, the FBG pulse stretchers and compressors of certain implementations discussed herein are configured to allow operation of dispersion-compensated mode-locked fiber lasers at pulse energies exceeding 1 nJ (e.g., exceeding 100 nJ), offering new opportunities for high power ultra-low noise fiber oscillator systems. In certain implementations, adaptive control of the dispersion properties of these FGBs can further optimize the performance of such oscillator systems.

FIG. 17A schematically illustrates an example near dispersion compensated high energy (e.g., high power) mode-locked (e.g., passively mode-locked) oscillator 900 incorporating a highly dispersive fiber Bragg grating in accordance with certain implementations described herein. The oscillator 900 of FIG. 17A comprises a chirped FBG 901 and a fiber gain section 902. The FBG 901 and the fiber gain section 902 can be spliced together for robust operation and convenience. The FBG 901 can also include adaptive dispersion control (not shown). In certain implementations, the FBG 901 is configured to receive pump light from a pump source (not shown) and the pump light is directed through the FBG 901 for pumping the fiber gain section 902 (e.g., via cladding pumping or core pumping).

The oscillator 900 of FIG. 17A further comprises at least one first lens 903 configured to collimate light emitted from a free end of the fiber gain section 902, a bulk dispersive element 905 (e.g., bulk grating pair or other dispersive elements) configured to receive the collimated light 906 from the at least one first lens 903 (the collimated light traversing the bulk dispersive element 905 shown by arrow 907), and at least one second lens 904 configured to focus (e.g., refocus) the collimated light 908 after traversing the bulk dispersive element 905.

The oscillator 900 of FIG. 17A further comprises a generalized saturable absorber 909 configured to receive the focused light from the at least one second lens 904, the saturable absorber 909 configured to reflect at least a portion of the received light. After reflection from the saturable absorber 909, the reflected light passes again through the at least one lens 904, the bulk dispersive element 905, the at least one first lens 903, and the fiber gain section 902, and is reflected from the FBG 901. The oscillator 900 is configured to use reflections from the FBG 901 and the saturable absorber 909 to repeatedly pass light forward and backward through the oscillator 900. During the forward and backward passing of light through the bulk dispersive element 905, an intra-cavity pulse is subject to the same dispersion. As schematically illustrated by FIG. 17A, the output 910 can be extracted from the non-reflected portion of the light that is transmitted through the FBG 901. In certain other implementations, the output 910 can be extracted from other locations in the oscillator 900 (e.g., via appropriate beam splitters).

In certain implementations, for a dispersion compensated cavity, the dispersions of the FBG 901 and the bulk dispersive element 905 (e.g., including the dispersions of other cavity components) are matched to one another (e.g., having equal magnitudes to within 10%). For example, in certain implementations, as schematically illustrated by FIG. 17A, the FBG 901 has a dispersion of $+2D_{21}$ and the bulk dispersive element 905 has a single-pass dispersion of $-D_{22}$ having a magnitude of about half the dispersion of the FBG 901 and having opposite sign from the dispersion of the FBG 901.

In certain other implementations, instead of the bulk dispersive element 905, the oscillator 900 comprises two additional FBGs with about half of the opposite dispersion of the FBG 901 and arranged via an optical circulator. In such an arrangement, the light is first reflected from the first additional FBG and then directed to the fast generalized saturable absorber 909, and after reflection from the second additional FBG is directed back to the intra-cavity gain fiber 902. In certain such implementations, the circulator is configured to allow for an integrated arrangement of the optics, but the fiber pigtails of the circulator may limit achievable pulse energies in some implementations. In certain other implementations (not shown), the example oscillator 900 of FIG. 17A is configured to use circulators in a ring cavity configuration. In certain implementations (not shown), the FBG 901 of FIG. 17A can also be replaced with a bulk optic positive dispersion producing element. In certain other implementations (not shown), the locations of the positive and negative dispersion elements of FIG. 17A can be switched around. In certain implementations, the grating pair 905 of FIGS. 17A and 17B generates a spatial chirp in collimated light beam 908 and the at least one lens 904 as well as saturable absorber 909. For example, this spatial chirp can be compensated by using an arrangement with two successive grating pairs (not shown).

In certain implementations, the dispersion of the FBG 901 and the bulk dispersive element 905 are configured such that the total second-order cavity dispersion is substantially equal to zero (e.g., the total cavity dispersion $D_{2cavity}$ is smaller than 10% of the second-order dispersion $D_{2FBG}$ of the FBG 901). In certain implementations in which the bulk dispersion element 905 has a single-pass dispersion which is about half of the dispersion of the FBG 901, a short pulse is generated at the location of the saturable absorber 909 and a chirped pulse is coupled out of the FBG 901. Moreover, during propagation through the intra-cavity fiber 902, the pulses can be strongly chirped, minimizing any nonlinearity from said fiber.

In certain implementations, the saturable absorber 909 comprises a semiconductor saturable absorber or any type of "fast" saturable absorber. The saturable absorber 909 can rely on the optical Kerr effect in a nonlinear optical element. For example, the Kerr effect can induce self-focussing or nonlinear polarization ellipse rotation in a nonlinear element that can be used as a fast saturable absorber 909. In certain other implementations, the saturable absorber 909 can comprise a short nonlinear fiber pigtail utilizing nonlinear polarization evolution in the nonlinear fiber pigtail (see, e.g., U.S. Pat. No. 5,689,519). In brief, nonlinear polarization evolution in a short length of fiber that is part of a Fabry-Perot cavity can be used as a fast saturable absorber 909 by the addition of appropriate waveplates and optional non-reciprocal optical elements on at least one end of the optical fiber.

FIG. 17B schematically illustrates another example near dispersion compensated high energy mode-locked oscillator 900 incorporating a highly dispersive fiber Bragg grating in which the saturable absorber 909 of FIG. 17A is replaced with a short length of fiber 911 in accordance with certain implementations described herein. As schematically illustrated by FIG. 17B, the at least one second lens 904 is configured to couple the intra-cavity light 908 into the fiber 911. To utilize nonlinear polarization evolution in the fiber 911 as a fast saturable absorber, certain implementations comprise at least one third lens 912 a reflective mirror 913, and at least two polarization manipulation elements 914, 915 having the fiber 911 therebetween. The at least one third lens 912 is configured to collimate and direct the output of the fiber 911 to the reflective mirror 913. The at least two polarization manipulation elements 914, 915 can comprise optical waveplates, polarizers, optical bandpass filters, and/or non-reciprocal elements such as Faraday rotators configured to optimize the fast saturable absorber action of the fiber 911, the at least one third lens 912, the reflective mirror 913, and the at least two polarization manipulation elements 914, 915 and/or to ensure environmental stability.

In certain implementations, the oscillator 900 further comprises electro-optic repetition rate and loss modulators configured to facilitate the onset of mode-locking and/or fast modulation of the repetition rate and carrier envelope offset frequency of the mode-locked oscillator 900. The oscillator 900 of certain implementations can use both negative and positive dispersion gain fiber. Fiber gain media such as Nd, Yb, Er, Er/Yb, Tm, Ho doped fiber or any other rare-earth doped fiber can be used as a gain medium.

FIGS. 18A-18D further explain operation of the example oscillators 900 schematically illustrated by FIGS. 17A and 17B. For FIGS. 18A-18D, the dispersion of the FBG 901 is 13 $ps^2$ and is matched to the double pass dispersion of the bulk dispersive element 905, which can be a bulk grating pair with groove density of 1200 lines/mm and a separation or around 1.5 cm. To compensate for the large value of third- and fourth-order dispersion in the bulk grating pair, the FBG 901 can be designed with appropriate values of third- and fourth-order dispersion.

Figure 18A:
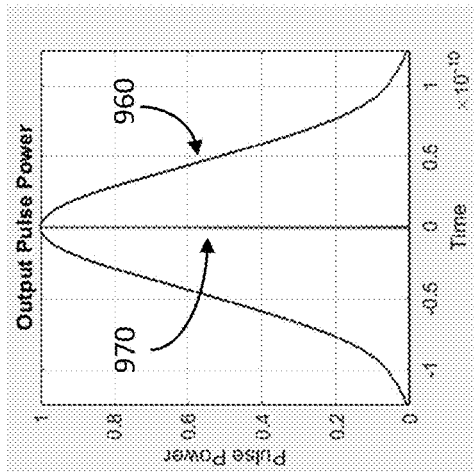
FIG. 18A schematically illustrates an example evolution of pulse energy as a function of intra-cavity gain fiber length (in meters) in the example mode-locked oscillator of FIG. 17A.

FIG. 18A schematically illustrates an example evolution of pulse energy along an Er gain fiber as a function of intra-cavity gain fiber length (in meters) in the example mode-locked oscillator of FIG. 17A. The dashed curve of FIG. 18A shows the pulse energy evolution from the FBG 901 to the intra-cavity bulk dispersion element 905, following the direction of arrow 1 of FIG. 17A. The solid curve of FIG. 18A shows the pulse energy evolution from the intra-cavity bulk dispersion element 905 to the FBG 901, following the direction of arrow 2 of FIG. 17A. For FIG. 18A, the FBG 901 has a reflectivity of 10% (such that most of the cavity loss is located at the FBG end), the Er gain fiber has a length of 0.5 m and a mode diameter of about 5 μm with positive dispersion. FIG. 18A shows that a pulse energy greater than or equal to 100 nJ can be extracted from the cavity schematically illustrated by FIG. 17A. This energy can be extracted from a nearly dispersion-compensated cavity, which can be a great improvement as compared to the energy extraction from other dispersion-compensated Er oscillators (e.g., having a maximum of about 1 nJ).

Figure 18B:
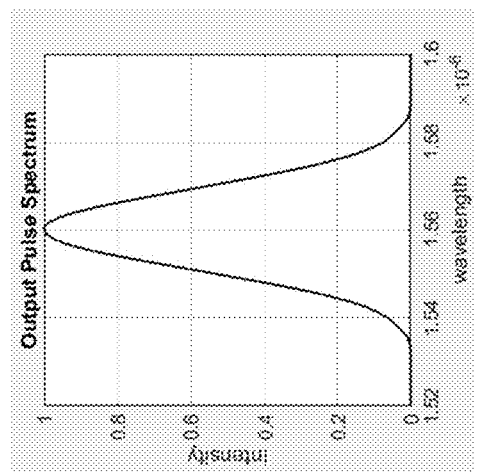
FIG. 18B schematically illustrates an example relative pulse peak powers as a function of time of the shortest and longest pulses generated in the example mode-locked oscillator of FIG. 17A.

FIG. 18B schematically illustrates an example relative pulse peak powers as a function of time of the shortest pulses and longest pulses generated in the example mode-locked oscillator of FIG. 17A. FIG. 18B shows the pulse shape 960 after reflection from the FBG 901 and the pulse shape 970 at the location of the fast saturable absorber 909. The pulse width after reflection from the FBG 901 is about 100 ps, and the pulse width at the location of the fast saturable absorber 909 is about 200 fs (e.g., the pulse width changes by about a factor of 500 around the cavity). Hence, during propagation through the gain fiber 902 of FIG. 17A, the pulse width can be greatly increased and self-phase modulation inside the intra-cavity fiber can be minimized, explaining the large achievable pulse energies even for a dispersion compensated cavity.

In certain implementations, the oscillator 900 of FIG. 17A advantageously provides pulse width changes of about a factor of 10 around the cavity for a FBG dispersion greater than or equal to 1.0 ps². The pulse width changes can be measured by comparing the pulse width emerging from the chirped FBG and the pulse width at the location of the saturable absorber. In certain implementations, the absolute value of the FBG second-order dispersion component $|D_{2FBG}|$ (e.g., +13 ps²) is at least 20 times larger (e.g., at least 100 times larger) than the absolute value of the total second-order dispersion component $|D_{2fiber}|$ of the intra-cavity fiber (e.g., a round trip Er fiber dispersion of 0.035 ps², resulting in a ratio of absolute values of about 371) and a pulse width (e.g., full width at half maximum width) extractable from the cavity after traversing down-stream dispersion compensation elements is less than or equal to 1 ps. In contrast, previous systems (e.g., M. E. Fermann et al., "Generation of 10 nJ from a modelocked Er fibre laser," Electronics Letters, 31, 194 (1994)) generated pulses with pulse widths of 300 fs using an FBG with a second-order dispersion component approximately equal to 3.5 ps², the second-order dispersion components of all the intra-cavity fiber of the oscillator summed to about −0.27 ps² (e.g., resulting in a ratio between FBG and fiber dispersion of about 13).

Figure 18C:
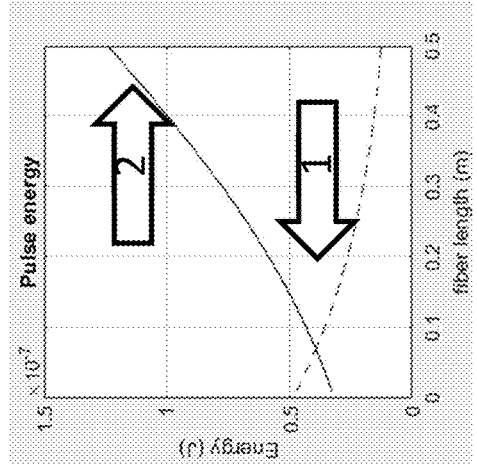
FIG. 18C schematically illustrates an example close-up view of the shortest pulse generated in the example mode-locked oscillator of FIG. 17A.
Figure 18D:
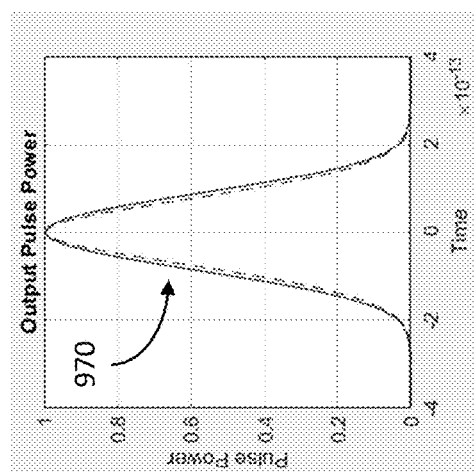
FIG. 18D schematically illustrates an example pulse spectrum of pulses generated in the mode-locked oscillator of FIG. 17A.

FIG. 18C schematically illustrates an example close-up view of the shortest pulse generated in the example mode-locked oscillator 900 of FIG. 17A, and FIG. 18D schematically illustrates the corresponding example pulse spectrum of pulses generated in the mode-locked oscillator 900 of FIG. 17A. The solid line of FIG. 18C shows the pulse shape 970 at the location of the saturable absorber 909 has a pulse width of about 200 fs. The equivalent bandwidth-limited pulse, shown by the dashed line of FIG. 18C, is essentially indistinguishable from the generated pulse at the resolution of FIG. 18C.

In certain implementations, by adjusting the dispersion profile of the FBG, pulse stability and achievable pulse energy inside the oscillator can be optimized. For example, the introduction of fourth-order and/or sixth-order dispersion in the FBG can improve pulse stability in the presence of negative dispersion gain fiber (e.g., Er, Er/Yb, Tm, Ho, or Ho/Yb doped fiber amplifiers) or positive dispersion gain fiber (e.g., Yb, Nd and Er fiber amplifiers). The cavity of certain implementations can operate equally well with positive as well as negative dispersion gain media.

In certain implementations, the pulse energies extractable from the cavities shown in FIGS. 17A and 17B can be in a range of 1 to 2 orders of magnitude higher than the maximum pulse energies extractable from standard dispersion compensated fiber oscillators. With optimized dispersion compensation, the pulse width generated from fiber oscillators as shown in FIG. 17A or 17B can be smaller than 100 fs. To generate the shortest possible pulses and to minimize the pump power utilized, it can also be useful to minimize intra-cavity loss as much as possible. The timing jitter from certain implementations described herein can be in a range of 3 to greater than 10 times smaller as compared to the timing jitter of standard oscillators, since quantum-limited timing jitter is inversely proportional to the square root of pulse energy. To minimize timing jitter, it can also be useful to generate the shortest possible pulses and to minimize intra-cavity loss as much as possible. Hence, certain implementations described herein provide high power oscillators that can be very useful as ultra-low noise microwave sources, since the achievable phase noise floor of a microwave source based on the stability of the repetition rate of an optical oscillator is inversely proportional to the mode-locked oscillator pulse energy for a given pulse bandwidth. For example, the shot-noise limited phase noise of a 10 GHz microwave signal generated by a mode-locked Er fiber laser according to certain implementations described herein can be less than or equal to −170 dBc/Hz at a carrier offset frequency of 10 kHz, and in certain implementation, a shot noise limited phase noise less than or equal to −180 dBc/Hz can be reached. To minimize timing jitter, athermal packaging of the FBG or at least some of the intra-cavity fiber can be implemented in certain implementations described herein. Athermal packaging of the intra-cavity fiber can, for example, comprise fiber with reduced or negative thermal coefficient of delay.

In addition, the individual cavity modes of the oscillator of certain implementations described herein can have a comparatively high power and therefore a low level of shot noise, as compared to standard fiber frequency combs, which can be useful for ultra-high precision optical frequency transfer with frequency combs, precision optical clocks, and metrology applications.

Additional Aspects

In a first aspect, a nonlinear fiber laser based chirped pulse amplification system is configured to generate output pulses in the femtosecond pulse width range. The system comprises a seed pulse source configured to produce short optical pulses, a fiber Bragg grating (FBG) pulse stretcher system configured to stretch said pulses, at least one amplifier, at least one FBG compressor configured to compress said pulses, and a bulk dispersive element for further compressing the pulses emerging from the FBG compressor. The FBG stretcher dispersion is configured to optimize the pulse quality of said output pulses at a designated elevated power level, said optimization in pulse quality producing a functional dependence of pulse quality on average pulse power or pulse energy in at least three stages: at low powers, the output pulses have a longer temporal width compared to said designated power level, at medium powers, the output pulses exhibit several side pulses with an intensity higher than any side pulses produced at said designated power level, and at said designated power level, the pulse quality is optimized, as characterized by side pulses with an intensity smaller than observed at medium power levels.

In a second aspect, a nonlinear fiber laser based chirped pulse amplification system according to aspect 1, wherein the pulses propagating in said FBG compressor are subject to integrated self-phase modulation phase values greater than 1.

In a third aspect, a nonlinear fiber laser based chirped pulse amplification system according to aspect 1, further comprising at least one optical fiber for further pulse compression or spectral broadening.

In a fourth aspect, a nonlinear fiber laser based chirped pulse amplification system is configured to generate output pulses in the sub-30 femtosecond pulse width range. The system comprises a seed pulse source configured to produce short optical pulses, a fiber Bragg grating (FBG) pulse stretcher system configured to stretch said pulses, at least one amplifier, at least one FBG compressor configured to compress said pulses, a bulk dispersive element configured to further compress the pulses emerging from the FBG compressor, and at least one optical fiber for further pulse compression of the pulses emerging from the FBG compressor.

In a fifth aspect, a nonlinear fiber laser based chirped pulse amplification system according to aspect 4, further configured to produce pulses with pulse widths less than 15 fs.

In a sixth aspect, a nonlinear fiber laser based chirped pulse amplification system according to aspect 4, further configured to produce sub-3 cycle pulses.

In a seventh aspect, a nonlinear fiber laser based chirped pulse amplification system according to aspects 1 or 4, further configured to generate pulses with a pulse energy greater than 20 nJ.

In an eighth aspect, a nonlinear fiber laser based chirped pulse amplification system according to aspects 1 or 4, further configured to generate over half an octave of output light with a pulse energy power greater than 10 nJ.

In a ninth aspect, a nonlinear fiber laser based chirped pulse amplification system according to aspect 8, further configured to generate a mid-IR output.

In a tenth aspect, a nonlinear fiber laser based chirped pulse amplification system according to aspects 1 or 4, said nonlinear chirped pulse amplification system used as a pump source for an optical parametric amplifier.

In an eleventh aspect, a nonlinear fiber laser based chirped pulse amplification system according to any one of aspects 1 to 10, further comprising adaptive control of the dispersion characteristics of the FBG stretcher.

In a twelfth aspect, a nonlinear fiber laser based chirped pulse amplification system according to any one of aspects 1 to 11, further comprising adaptive control of the dispersion characteristics of the FBG compressor.

In a thirteenth aspect, a nonlinear fiber laser based chirped pulse amplification system according to any one of aspects 1 to 12, comprising Er, Yb, Tm, Ho, Er/Yb or Tm/Yb fibers.

In a fourteenth aspect, a nonlinear fiber laser based chirped pulse amplification system according to any one of aspects 1 to 13, said FBG compressor being replaced with a volume Bragg grating compressor.

In a fifteenth aspect, a nonlinear fiber laser based chirped pulse amplification system according to any one of aspects 1 to 14, further comprising means for coherent addition of at least two pulses.

In a sixteenth aspect, an optical source comprises a seed source producing short optical pulses, one or more actuators for controlling the carrier envelope offset frequency of the output of said seed source, a splitter that splits the output of said seed source into an amplifier branch and an f-2f branch, a frequency shifter in said f-2f branch, an f-2f interferometer in said f-2f branch, a photodetector configured to detect the f-2f signal from said f-2f interferometer, a combiner configured to interfere a portion of light from said f-2f branch with a portion of light from said amplifier branch, a photodetector configured to detect light from said combiner, electronics configured to convert the signals from both said photodetectors into a signal representing the carrier envelope offset frequency at the output of said amplifier branch, and a feedback circuit configured to control the carrier envelope frequency at the output of said amplifier branch.

In a seventeenth aspect, an optical source according to aspect 16, further comprising an optical amplifier in said amplifier branch.

In an eighteenth aspect, an optical source according to aspect 16 or aspect 17, wherein said electronics includes one or more radio frequency generators, and one or more radio frequency mixers.

In a nineteenth aspect, an optical source according to any of aspects 16 to 18, further comprising a carrier envelope phase measurement device and a feedback circuit configured to stabilize the carrier envelope phase at the output of said amplifier branch.

In a twentieth aspect, an optical source according to aspect 19, further comprising an actuator configured to control the carrier envelope phase of the output of said amplifier branch.

In a twenty-first aspect, an optical source according to aspect 20, wherein said actuator is a transmissive plate.

In a twenty-second aspect, an optical source according to any of aspects 16 to 21, wherein said seed source and said amplifier comprise the optical source of any one of aspects 1-15.

In a twenty-third aspect, a nonlinear fiber laser based chirped pulse amplification system is configured to generate output pulses in the femtosecond pulse width range. The system comprises a seed pulse source configured to produce short optical pulses, at least one fiber Bragg grating (FBG) pulse stretcher or compressor configured to stretch or compress pulses anywhere within said nonlinear fiber based chirped pulse amplification system, adaptive dispersion control of said at least one FBG, and a gas filled hollow fiber compressor for further compression of said output pulses.

In a twenty-fourth aspect, a method produces femtosecond pulses with a nonlinear chirped pulse amplification system seeded with an oscillator. The method comprises temporally stretching said pulses with a FBG, amplifying said pulses, and compressing said pulses to produce compressed output pulses. The FBG is configured to optimize the pulse quality of said output pulses at a designated elevated power level, said optimization in pulse quality producing a functional dependence of pulse quality on average pulse power or pulse energy in at least three stages: at low powers, the output pulses have a longer temporal width compared to said designated power level, at medium powers, the output pulses exhibit several side pulses with an intensity higher than any side pulses produced at said designated power level, and at said designated power level the pulse quality is optimized, as characterized by side pulses with an intensity smaller than observed at medium power levels.

In a twenty-fifth aspect, the method of aspect 24, wherein a peak intensity of the pulses is at a maximum at the designated power level.

In a twenty-sixth aspect, a pulse source comprises an oscillator configured to generate laser pulses and at least one fiber Bragg grating (FBG) pulse stretcher configured to receive the laser pulses from the oscillator and to temporally stretch the laser pulses, the at least one FBG pulse stretcher configured to be adaptively controlled to provide adjustable dispersion. The pulse source further comprises at least one amplifier configured to receive the temporally stretched laser pulses, at least one FBG pulse compressor configured to receive the laser pulses from the at least one amplifier and to temporally compress the laser pulses, and one or more optical compressor components configured to receive and further compress the compressed laser pulses from the at least one FBG pulse compressor.

In a twenty-seventh aspect, the pulse source of aspect 26, wherein the laser pulses have pulse widths in a range of 30 to 600 femtoseconds.

In a twenty-eighth aspect, the pulse source of aspect 26 or aspect 27, wherein the oscillator comprises a mode-locked fiber laser comprising one or more of the following materials: Er, Nd, Yb, Tm, Ho, and Er/Yb.

In a twenty-ninth aspect, the pulse source of any of aspects 26 to 28, wherein the oscillator comprises at least one pre-amplifier configured to amplify the laser pulses prior to being emitted from the oscillator.

In a thirtieth aspect, the pulse source of any of aspects 26 to 29, wherein the at least one pulse stretcher is configured to increase the pulse widths of the laser pulses to be in a range of 100 fs to 1000 ps.

In a thirty-first aspect, the pulse source of any of aspects 26 to 30, wherein the at least one amplifier comprises a preamplifier and an amplifier.

In a thirty-second aspect, the pulse source of any of aspects 26 to 31, wherein the at least one FBG pulse compressor is configured to decrease the pulse widths of the laser pulses to be in a range of 50 to 1000 femtoseconds.

In a thirty-third aspect, the pulse source of any of aspects 26 to 32, wherein the one or more optical compressor components comprises an optical fiber pigtail and/or a dispersive free-space compressor.

In a thirty-fourth aspect, the pulse source of any of aspects 26 to 33, wherein the one or more optical compressor components comprises at least one optical fiber, chirped mirror, or other optical materials configure to provide a predetermined pulse quality for the laser pulses emitted by the pulse source.

Additional Information

Example, non-limiting experimental data are included herein to illustrate results achievable by various implementations of the systems and methods described herein. All ranges of data and all values within such ranges of data that are shown in the figures or described in the specification are expressly included in this disclosure. The example experiments, experimental data, tables, graphs, plots, figures, and processing and/or operating parameters (e.g., values and/or ranges) described herein are intended to be illustrative of operating conditions of the disclosed systems and methods and are not intended to limit the scope of the operating conditions for various implementations of the methods and systems disclosed herein. Additionally, the experiments, experimental data, calculated data, tables, graphs, plots, figures, and other data disclosed herein demonstrate various regimes in which implementations of the disclosed systems and methods may operate effectively to produce one or more desired results. Such operating regimes and desired results are not limited solely to specific values of operating parameters, conditions, or results shown, for example, in a table, graph, plot, or figure, but also include suitable ranges including or spanning these specific values. Accordingly, the values disclosed herein include the range of values between any of the values listed or shown in the tables, graphs, plots, figures, etc. Additionally, the values disclosed herein include the range of values above or below any of the values listed or shown in the tables, graphs, plots, figures, etc. as might be demonstrated by other values listed or shown in the tables, graphs, plots, figures, etc. Also, although the data disclosed herein may establish one or more effective operating ranges and/or one or more desired results for certain implementations, it is to be understood that not every implementation need be operable in each such operating range or need produce each such desired result. Further, other implementations of the disclosed systems and methods may operate in other operating regimes and/or produce other results than shown and described with reference to the example experiments, experimental data, tables, graphs, plots, figures, and other data herein.

The invention has been described in several non-limiting implementations. It is to be understood that the implementations are not mutually exclusive, and elements described in connection with one implementation may be combined with, rearranged, or eliminated from, other implementations in suitable ways to accomplish desired design objectives. No single feature or group of features is necessary or required for each implementation.

For purposes of summarizing the present invention, certain aspects, advantages and novel features of the present invention are described herein. It is to be understood, however, that not necessarily all such advantages may be achieved in accordance with any particular implementation. Thus, the present invention may be embodied or carried out in a manner that achieves one or more advantages without necessarily achieving other advantages as may be taught or suggested herein.

As used herein any reference to "one implementation" or "some implementations" or "an implementation" means that a particular element, feature, structure, or characteristic described in connection with the implementation is included in at least one implementation. The appearances of the phrase "in one implementation" in various places in the specification are not necessarily all referring to the same implementation. Conditional language used herein, such as, among others, "can," "could," "might," "may," "e.g.," and the like, unless specifically stated otherwise, or otherwise understood within the context as used, is generally intended to convey that certain implementations include, while other implementations do not include, certain features, elements and/or steps. In addition, the articles "a" or "an" or "the" as used in this application and the appended claims are to be construed to mean "one or more" or "at least one" unless specified otherwise.

As used herein, the terms "comprises," "comprising," "includes," "including," "has," "having" or any other variation thereof, are open-ended terms and intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), or both A and B are true (or present).

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain implementations require at least one of X, at least one of Y, and at least one of Z to each be present.

Thus, while only certain implementations have been specifically described herein, it will be apparent that numerous modifications may be made thereto without departing from the spirit and scope of the invention. Further, acronyms are used merely to enhance the readability of the specification and claims. It should be noted that these acronyms are not intended to lessen the generality of the terms used and they should not be construed to restrict the scope of the claims to the implementations described therein.

What is claimed is:

1. A pulse transformer for modifying the amplitude and phase of short optical pulses, the pulse transformer comprising:
- a pulse source;
- a stretcher comprising at least one first fiber Bragg grating (FBG) configured to receive input pulses from the pulse source, the stretcher having a first second-order dispersion parameter ($D_{21}$);
- at least one optical amplifier configured to receive pulses from the at least one first FBG;
- a compressor comprising at least one second FBG configured to receive pulses from the at least one optical amplifier, the compressor having a second second-order dispersion parameter ($-D_{22}$), an absolute value of the first second-order dispersion parameter ($|D_{21}|$) and an absolute value of the second second-order dispersion parameter ($|-D_{22}|$) substantially equal to one another to within 10%, at least one of the stretcher and the compressor configured to be adaptively controlled;
- a bandwidth broadening nonlinear element configured to receive pulses from the compressor; and
- a dispersive element configured to compress pulses received from the nonlinear element to produce output pulses with a reduced pulse curvature compared to the input pulses.

2. A pulse transformer according to claim 1, wherein $|D_{21}|$ and $|-D_{22}|$ are substantially equal to one another to within 1%.

3. A pulse transformer according to claim 1, wherein the nonlinear element comprises an element with negative dispersion or an element with positive dispersion.

4. A pulse transformer according to claim 1, wherein the nonlinear element is selected from the group consisting of: telecommunication fiber, large core fiber, fluoride fiber, chalcogenide fiber, or a gas-filled hollow core fiber.

5. A pulse transformer according to claim 1, wherein the at least one optical amplifier comprises a fiber amplifier or a solid-state amplifier.

6. A pulse transformer according to claim 1, further comprising:
- a beam splitter; and
- a pulse diagnostic system configured to record a pulse form or a pulse peak power of pulses received by the pulse diagnostic system from the beam splitter, the pulse diagnostic system configured to transmit information regarding the pulses received by the pulse diagnostic system to the stretcher or the compressor.

7. A pulse transformer according to claim 1, further comprising at least one nonlinear optical element configured to enable generation of pulses with a temporal width of a few optical cycles.

8. A pulse transformer according to claim 1, wherein either the at least one second FBG of the compressor or the at least one first FBG of the stretcher comprises an adaptively controlled FBG.

9. The pulse transformer of claim 1, further comprising:
- a first nonlinear element comprising the at least one optical amplifier and configured to subject the stretched pulses to self-phase modulation;
- a second nonlinear element configured to receive pulses from the pulse compressor and to subject the received pulses to bandwidth broadening; and
- a dispersive element configured to compress pulses received from the second nonlinear element.

10. A pulse transformer for modifying the amplitude and phase of short optical pulses, the pulse transformer comprising:
- a pulse source;
- a stretcher comprising at least one first fiber Bragg grating (FBG) configured to receive input pulses from the pulse source, the stretcher having a first second-order dispersion parameter ($D_{21}$);
- at least one optical amplifier configured to receive pulses from the at least one first FBG; and
- a compressor comprising at least one second FBG configured to receive pulses from the at least one optical amplifier, the compressor having a second second-order dispersion parameter ($-D_{22}$), an absolute value of the first second-order dispersion parameter ($|D_{21}|$) and an absolute value of the second second-order dispersion parameter ($|-D_{22}|$) substantially equal to one another to within 10%, at least one of the stretcher and the compressor configured to be adaptively controlled,
- wherein both the at least one second FBG of the compressor and the at least one first FBG of the stretcher comprise adaptively controlled FBGs.

* * * * *

UNITED STATES PATENT AND TRADEMARK OFFICE
CERTIFICATE OF CORRECTION

PATENT NO. : 11,881,681 B2
APPLICATION NO. : 17/113409
DATED : January 23, 2024
INVENTOR(S) : Martin E. Fermann It is certified that error appears in the above-identified patent and that said Letters Patent is hereby corrected as shown below:

In the Specification

Column 14, Line 26, delete "100" and insert -- 10 --.

In the Claims

Column 32, Line 19 (approx.), Claim 9, delete "the pulse" and insert -- the --.

Signed and Sealed this
Thirtieth Day of April, 2024

Katherine Kelly Vidal
*Director of the United States Patent and Trademark Office*